(12) United States Patent
Dehe et al.

(10) Patent No.: US 10,370,242 B2
(45) Date of Patent: Aug. 6, 2019

(54) MICROELECTROMECHANICAL DEVICE, A MICROELECTROMECHANICAL SYSTEM, AND A METHOD OF MANUFACTURING A MICROELECTROMECHANICAL DEVICE

(71) Applicant: Infineon Technologies AG, Neubiberg (DE)

(72) Inventors: Alfons Dehe, Reutlingen (DE); Matthias Friedrich Herrmann, Munich (DE); Johannes Manz, Munich (DE)

(73) Assignee: INFINEON TECHNOLOGIES AG, Neubiberg (DE)

( * ) Notice: Subject to any disclaimer, the term of this patent is extended or adjusted under 35 U.S.C. 154(b) by 0 days.

(21) Appl. No.: 15/662,389

(22) Filed: Jul. 28, 2017

(65) Prior Publication Data
US 2018/0029878 A1 Feb. 1, 2018

(30) Foreign Application Priority Data

Jul. 29, 2016 (DE) .................. 10 2016 114 047

(51) Int. Cl.
*B81B 7/00* (2006.01)
*B81B 3/00* (2006.01)
*B81C 1/00* (2006.01)

(52) U.S. Cl.
CPC .......... *B81B 7/0061* (2013.01); *B81B 3/0021* (2013.01); *B81C 1/00158* (2013.01);
(Continued)

(58) Field of Classification Search
CPC ............... B81B 7/0061; B81B 7/0021; B81B 2201/0257; B81B 2201/033;
(Continued)

(56) References Cited

U.S. PATENT DOCUMENTS 8,724,200 B1 * 5/2014 Wu .................... G02B 26/0858
359/224.1
2013/0243234 A1 9/2013 Zoellin et al.
(Continued)

FOREIGN PATENT DOCUMENTS

CN 103922271 A 7/2014
CN 104105040 A 10/2014
(Continued)

OTHER PUBLICATIONS

Marc Fueldner et al., "Dual Back Plate Silicon MEMS Microphone: Balancing High Performance!", DAGA 2015 Nuernberg, 2015, pp. 41-43.
(Continued)

*Primary Examiner* — Tucker J Wright
(74) *Attorney, Agent, or Firm* — Viering, Jentschura & Partner MBB

(57) ABSTRACT

A microelectromechanical device, a microelectromechanical system, and a method of manufacturing a microelectromechanical device, wherein the microelectromechanical device may include: a substrate; a diaphragm mounted to the substrate; a first electrode mounted to the diaphragm; a second electrode mounted to the substrate; wherein the first electrode is laterally adjacent to the second electrode; and wherein the diaphragm is arranged over a gap between the first electrode and the second electrode.

19 Claims, 14 Drawing Sheets

(52) U.S. Cl.
CPC .. *B81C 1/00166* (2013.01); *B81B 2201/0257* (2013.01); *B81B 2201/033* (2013.01); *B81B 2203/0127* (2013.01); *B81B 2203/04* (2013.01)

(58) Field of Classification Search
CPC .... B81B 2203/0136; B81B 2203/0127; B81C 1/00158; B81C 1/00166; H04R 19/005
See application file for complete search history.

(56) References Cited

U.S. PATENT DOCUMENTS

| | | |
|---|---|---|
| 2014/0105428 A1 | 4/2014 | Zoellin et al. |
| 2014/0109680 A1* | 4/2014 | Tsai ................. G01L 11/04 73/702 |
| 2014/0197502 A1 | 7/2014 | Dehe |
| 2014/0233767 A1 | 8/2014 | Chen et al. |
| 2014/0322854 A1 | 10/2014 | Nakatani et al. |
| 2015/0008541 A1 | 1/2015 | Hong |
| 2015/0021722 A1 | 1/2015 | Dehe et al. |
| 2015/0110309 A1 | 4/2015 | Park et al. |

FOREIGN PATENT DOCUMENTS

| | | |
|---|---|---|
| CN | 104280160 A | 1/2015 |
| CN | 104333838 A | 2/2015 |
| DE | 102012203900 A1 | 9/2013 |
| DE | 102012218501 A1 | 4/2014 |
| JP | 2008252847 A | 10/2008 |

OTHER PUBLICATIONS

Chinese Office Action issued for corresponding Chinese patent application 201710633525.2, dated Jan. 18, 2019, 6 pages (for informational purpose only).

Chinese First Search Report for corresponding Chinese patent application 201710633525.2, dated Jan. 8, 2019, 2 pages (for informational purpose only).

* cited by examiner

MICROELECTROMECHANICAL DEVICE, A MICROELECTROMECHANICAL SYSTEM, AND A METHOD OF MANUFACTURING A MICROELECTROMECHANICAL DEVICE

CROSS-REFERENCE TO RELATED APPLICATION

This application claims priority to German Patent Application Serial No. 10 2016 114 047.3, which was filed Jul. 29, 2016, and is incorporated herein by reference in its entirety.

TECHNICAL FIELD

Various embodiments relate generally to a microelectromechanical device, a microelectromechanical system, and a method of manufacturing a microelectromechanical device.

BACKGROUND

Silicon microelectromechanical systems (MEMS), for example, a MEMS microphone, may have a pressure sensitive diaphragm and a perforated back plate to provide an electrostatic read out. The signal to noise ratio in such arrangements may be limited by air friction in the perforated back plate that causes noise. In comparison, MEMS with a comb electrode structure may have significantly reduced noise due to the comb electrode arrangement, however, comb electrode structures have large ventilation areas (for example, gaps, through which incident sounds (e.g., a pressure wave) may pass without significantly affecting the diaphragm), which reduce resolution of low frequency sound. Conventional comb electrode structure MEMS attempt to reduce ventilation areas by reducing distance between electrode fingers. This solution is limited by dimensional feasibility allowed by various fabrication methods.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments of the invention are described with reference to the following drawings, in which.

DESCRIPTION

Figure 1A:
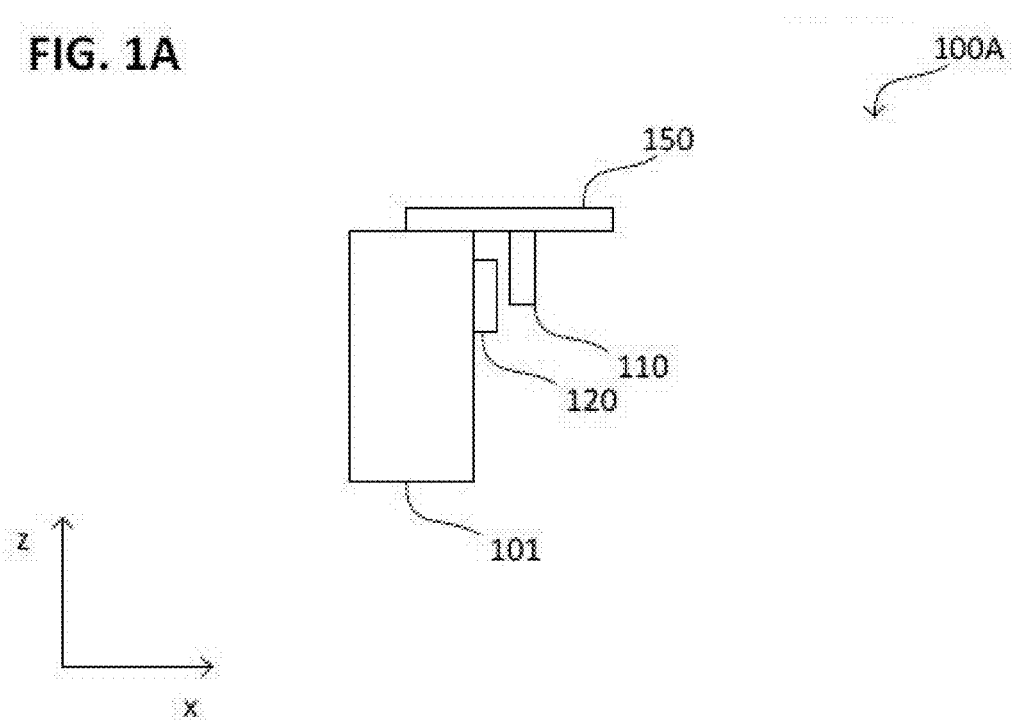
FIGS. 1A & 1B show a microelectromechanical device in cross-section.

The following detailed description refers to the accompanying drawings that show, by way of illustration, specific details and embodiments in which the invention may be practiced.

The word "exemplary" is used herein to mean "serving as an example, instance, or illustration". Any embodiment or design described herein as "exemplary" is not necessarily to be construed as preferred or advantageous over other embodiments or designs.

The word "over" used with regards to a deposited material formed "over" a side or surface, may be used herein to mean that the deposited material may be formed "directly on", e.g., in direct contact with, the implied side or surface. The word "over" used with regards to a deposited material formed "over" a side or surface, may be used herein to mean that the deposited material may be formed "indirectly on" the implied side or surface with one or more additional layers being arranged between the implied side or surface and the deposited material.

As used herein, a "circuit" may be understood as any kind of logic (analog or digital) implementing entity, which may be special purpose circuitry or a processor executing software stored in a memory, firmware, hardware, or any combination thereof. Furthermore, a "circuit" may be a hard-wired logic circuit or a programmable logic circuit such as a programmable processor, for example a microprocessor (for example a Complex Instruction Set Computer (CISC) processor or a Reduced Instruction Set Computer (RISC) processor). A "circuit" may also be a processor executing software, for example, any kind of computer program, for example a computer program using a virtual machine code such as, for example, Java. Any other kind of implementation of the respective functions which will be described in more detail below may also be understood as a "circuit". It is understood that any two (or more) of the described circuits may be combined into a single circuit with substantially equivalent functionality, and, conversely, that any single described circuit may be distributed into two (or more) separate circuits with substantially equivalent functionality. In particular with respect to the use of "circuitry" in the Claims included herein, the use of "circuit" may be understood as collectively referring to two or more circuits.

The term "forming" may refer to disposing, arranging, structuring, or depositing. A method for forming, e.g., a layer, a material, or a region, etc., may include various deposition methods which, inter alia, may include: chemical vapor deposition, physical vapor deposition (e.g., for dielectric materials), electrodeposition (which may also be referred to as electroplating, e.g., for metals or metal alloys), or spin coating (e.g., for fluid materials). Generally, a vapor deposition may be performed by sputtering, laser ablation, cathodic arc vaporization, or thermal evaporation. A method for forming metals may include metal plating, e.g., electroplating or chemical plating.

The term "forming" may also include a chemical reaction or fabrication of a chemical composition, where, for example, at least a portion of the layer, the material, or the region is formed by a transformation of one set of chemical substances into the chemical composition. "Forming" may, for example, include: changing the positions of electrons by breaking or forming chemical bonds between atoms of the set of chemical substances. The term "forming" may further include oxidation and reduction, complexation, precipitation, acid-base reaction, solid-state reaction, substitution, doping, addition and elimination, diffusion, or a photochemical reaction. "Forming" may, for example, change the chemical and physical properties of the set of chemical substances which chemically compose a portion of the layer, material, or region. Exemplary chemical properties or physical properties may include electrical conductivity, phase composition, or optical properties, etc. "Forming" may, e.g., include the application of a chemical reagent to an initial compound to change the chemical and physical properties of the initial compound.

The term "structuring" may refer to modifying the form of a structure (e.g., modifying the structure to achieve a desired shape or a desired pattern). To structure, e.g., a material, a portion of the material may be removed, e.g., via etching. To remove material from, for example a layer, material, or region, a mask (that provides a pattern) may be used, i.e., the mask provides a pattern for removing material (e.g., etching a structure to remove material of the structure) according to the pattern of the mask. Illustratively, the mask may prevent regions (which may be intended to remain) from being removed (e.g., by etching). Alternatively or additionally, to structure the layer, the material or the region of material may be disposed using a mask (the mask providing a pattern). The mask may provide a pattern for forming (e.g., disposing) material in accordance with the pattern of the mask.

In general, removing material may include a process such as etching of the material. The term "etching" may include various etching procedures, e.g., chemical etching (including, for example, wet etching or dry etching), physical etching, plasma etching, ion etching, etc. In etching a layer, a material, or a region, an etchant may be applied to the layer, the material, or the region. For example, the etchant may react with the layer, the material, or the region, forming a substance (or chemical compound) which may be easily removed, e.g., a volatile substance. Alternatively or additionally, the etchant may, for example, vaporize the layer, the material, or the region.

Additionally or alternatively, removing material may include a process involving chemical and mechanical means, e.g., chemical mechanical polishing (or chemical mechanical planarization). The term "chemical mechanical planarization" may include a combination of chemical and mechanical material removal processes such as abrasion (e.g., application of a polishing pad with a surface that abrades the material) in conjunction with a slurry (e.g., a colloid that may include additional abrasive particles as well as contents that are corrosive to the material).

A mask may be a temporary mask, i.e., it may be removed after etching (e.g., the mask may be formed from a resin or a metal or another material such as a hard mask material such as silicon oxide, silicon nitride, or carbon, etc.) or the mask may be a permanent mask (e.g., a mask-blade), which may be used several times. A temporary mask may be formed, e.g., using a photomask.

According to various embodiments, a microelectromechanical device may be formed as part of, or may include, a semiconductor chip. For example, the semiconductor chip may include the microelectromechanical component (which may also be referred to as a microelectromechanical system). In other words, the microelectromechanical component may be implemented into (e.g., may be part of) a semiconductor chip, e.g., monolithically integrated. The semiconductor chip (which may also be referred to as a chip, die, or microchip) may be processed in semiconductor technologies, on a wafer, or in a wafer (or, e.g., a substrate or a carrier). The semiconductor chip may include one or more microelectromechanical systems (MEMS), which are formed during semiconductor technology processing or fabrication. The semiconductor carrier may be part of the semiconductor chip, e.g., the semiconductor carrier may be part of, or may form, the semiconductor body of the chip. Optionally, the microelectromechanical component may be part of, or may be electrically coupled to, an integrated circuit on the chip.

According to various embodiments, a semiconductor carrier (e.g., of a microelectromechanical device, e.g., the semiconductor carrier of a semiconductor chip) may be singulated from a wafer by removing material from a kerf region of the wafer (also referred to as dicing or cutting the wafer). For example, removing material from the kerf region of the wafer may be processed by scribing and breaking, cleavage, blade dicing, or mechanical sawing (e.g., using a dicing saw). In other words, the semiconductor carrier may be singulated by a wafer dicing process. After the wafer dicing process, the semiconductor carrier (or the finished microelectromechanical device) may be electrically contacted and encapsulated, e.g., by mold materials, into a chip carrier (which may also be referred to as a chip housing) which may then be suitable for use in electronic devices, such as gauges. For example, the semiconductor chip may be bonded to a chip carrier by wires. Furthermore, the semiconductor chip (which may be bonded to a chip carrier) may be mounted (e.g., soldered) onto a printed circuit board.

According to various embodiments, a semiconductor carrier (e.g., of a microelectromechanical device or the semiconductor carrier of a semiconductor chip) may include or may be made of (in other words, formed from) semiconductor materials of various types, including a group IV semiconductor (e.g., silicon or germanium), a compound semiconductor, e.g., a group III-V compound semiconductor (e.g., gallium arsenide), or other types, including group III semiconductors, group V semiconductors, or polymers, for example. In an embodiment, the semiconductor carrier may be doped or undoped. In an alternative embodiment, the semiconductor carrier may be a silicon on insulator (SOI) wafer. As an alternative, any other suitable semiconductor material may be used for the semiconductor carrier, for example, semiconductor compound material such as gallium phosphide (GaP), indium phosphide (InP), or any suitable ternary semiconductor compound material, such as indium gallium arsenide (InGaAs), or quaternary semiconductor compound material, such as aluminum gallium indium phosphide (AlInGaP).

According to various embodiments, a semiconductor carrier (e.g., of a microelectromechanical device or the semiconductor carrier of a semiconductor chip) may be covered with a passivation layer for protecting the semiconductor carrier from environmental influence, e.g., oxidation. The passivation layer may include a metal oxide, an oxide of the semiconductor carrier (which may also be referred to as a substrate or semiconductor body), e.g., silicon oxide, a nitride, e.g., silicon nitride, a polymer, e.g., benzocyclobutene (BCB) or polyimide (PI), a resin, a resist, or a dielectric material.

According to various embodiments, an electrically conductive material may include or may be formed from: a metal, a metal alloy, an intermetallic compound, a silicide (e.g., titanium silicide, molybdenum silicide, tantalum silicide, or tungsten silicide), a conductive polymer, a polycrystalline semiconductor, or a highly doped semiconductor, e.g., polycrystalline silicon (which may also be referred to as polysilicon), or a highly doped silicon. An electrically conductive material may be understood as material with moderate electrical conductivity, e.g., with an electrical conductivity (measured at room temperature and constant electric field direction) greater than about 10 S/m, e.g., greater than about $10^2$ S/m, or with high electrical conductivity, e.g., greater than about $10^4$ S/m, e.g., greater than about $10^6$ S/m.

According to various embodiments, a metal may include or may be formed from one element of the following group of elements: aluminum, copper, nickel, magnesium, chromium, iron, zinc, tin, gold, silver, iridium, platinum, or titanium. Alternatively or additionally, a metal may include or may be formed from a metal alloy including one element or more than one element. For example, a metal alloy may include an intermetallic compound, e.g., an intermetallic compound of gold and aluminum, an intermetallic compound of copper and aluminum, an intermetallic compound of copper and zinc (brass) or an intermetallic compound of copper and tin (bronze).

According to various embodiments, an electrically insulating material, e.g., a dielectric material, may be understood as material with poor electrical conductivity, e.g., with an electrical conductivity (measured at room temperature and constant electric field direction) less than about 10'S/m, e.g., less than about $10^{-5}$ S/m, or, e.g., less than about 10'S/m.

According to various embodiments, an insulating material may include a semiconductor oxide, a metal oxide, a ceramic, a semiconductor nitride, a metal nitride, a semiconductor carbide, a metal carbide, a glass, e.g., fluorosilicate glass (FSG), a dielectric polymer, a silicate, e.g., hafnium silicate or zirconium silicate, a transition metal oxide, e.g., hafnium dioxide or zirconium dioxide, an oxynitride, e.g., silicon oxynitride, or any other type of dielectric material. An insulating material may withstand an electric field without breaking down (in other words without experiencing failure of its insulating properties, e.g., without substantially changing its electrical conductivity).

According to various embodiments, a microelectromechanical component may be configured to at least one of: provide a force to actuate a means for actuating in response to an electrical signal transmitted to the electrically-conductive component and provide an electrical signal in response to an actuation of the means for actuating, e.g., in response to a mechanical wave. The means for actuating (e.g., a diaphragm) may be mounted to a substrate in various ways, for example, a floating mount, a cantilever mount, a bridge mount, e.g., a membrane substantially anchored along one lateral axis, or substantially mounted along a perimeter of the means for actuating. In general, a microelectromechanical component may be configured to transfer mechanical energy into electrical energy and/or electrical energy into mechanical energy. In other words, a microelectromechanical component may function as a transducer that is configured to convert mechanical energy into electrical energy or vice versa. A microelectromechanical component may have a size in the range from about a few micrometers (μm) to about a few millimeters (mm), e.g., in the range from about a 10 μm to about 5 mm, e.g., in the range from about a 100 μm to about 2 mm, e.g., about 1 mm, or, alternatively, smaller than about 1 mm, e.g., smaller than 500 μm, e.g., smaller than 100 μm. A microelectromechanical component according to various embodiments may be processed in semiconductor technology.

A microelectromechanical component according to various embodiments may be used as a sensor (e.g., a microsensor) for sensing a mechanical signal and to generate an electrical signal which represents the mechanical signal. Alternatively, a microelectromechanical component may be used as an actuator for generating a mechanical signal based on the electrical signal. For example, the microelectromechanical component may be used as microphone.

The microelectromechanical component may include a diaphragm. The diaphragm may be configured to actuate in response to a force. The force may be provided externally from the microelectromechanical component, i.e., the force may not originate from the microelectromechanical device. The force may be a mechanical interaction, i.e., a pressure-gradient, e.g., a mechanical wave (including acoustic waves or sound waves) or pressure. Additionally or alternatively, the force may be an electric field interaction, i.e., a Coulomb force or an electrostatic force, or may be a magnetic field interaction, e.g., magnetic force, such as Lorentz force, etc. An electrically-conductive component, e.g., an electrode or a sensor, may provide an electrical signal in response to the actuation of the diaphragm. The electrical signal may represent the force on the diaphragm or the actuation of the diaphragm (e.g., or the electrical signal may be proportional to the force).

A microelectromechanical device including a diaphragm and a comb electrode structure read out may have the advantage of reduced noise due to the electrode structure (low damping) and improved low frequency resolution from the diaphragm. As shown in cross-section in FIG. 1, a microelectromechanical device 100A may include a substrate 101, a diaphragm 150 mounted to the substrate 101, a first electrode 110 mounted to the diaphragm 150, a second electrode 120 mounted to the substrate 101, wherein the firsts electrode 110 is laterally adjacent to the second electrode 120, and wherein the diaphragm 150 is arranged over a gap between the first electrode 110 and the second electrode 120.

An acoustic or sound wave may impact diaphragm 150, causing diaphragm 150 to deflect, which may cause first electrode 110 to move relative to second electrode 120. First electrode 110 and second electrode 120 may be arranged as comb electrodes, i.e., an electrical signal read out may represent a capacitive relationship between the two electrodes. The capacitive relationship may be defined by a deflection of the first electrode 110 in relation to second electrode 120 in a direction along the z-axis. The movement of the electrodes may vary an alignment of two surfaces of the first electrode 110 and the second electrode 120 that are laterally adjacent to one another. For example, a movement of first electrode 110 may cause a greater area to be aligned with second electrode 120, which may result in an increased value of the electrical output signal. Likewise, a movement of first electrode 110 may cause less area to be aligned with second electrode 120, which may result in a decreased value of the electrical output signal.

In comparison, a condenser microelectromechanical device may have a capacitive relationship that may be defined by a distance between a diaphragm (which may also be an electrode) and a back plate electrode, i.e., a change in distance between two parallel electrodes may result from a sound wave impacting the diaphragm. Movement of first electrode 110 and second electrode 120 may be substantially parallel to one another in that a (lateral) distance between first electrode 110 and second electrode 120 may not substantially vary as in the condenser microelectromechanical device (which may vary a vertical distance between electrodes).

Substrate 101 may be formed from a passive substrate material, for example, silicon, such as monocrystalline silicon, polycrystalline silicon, microcrystalline silicon, or nanocrystalline silicon, and may include an oxide layer, such as an oxide of silicon, e.g., silicon dioxide.

Diaphragm 150 may be formed from silicon, for example, polycrystalline silicon, monocrystalline silicon, microcrystalline silicon, or nanocrystalline silicon. Diaphragm 150 may have a circular shape with a diameter in a range of 200 µm to 2,000 µm. In addition, diaphragm 150 may include at least one ventilation opening (ventilation holes), e.g., from 4-50 ventilation openings.

In microelectromechanical device 100A, the arrangement of first electrode 110 and second electrode 120 may be advantageous in that the ventilation within microelectromechanical device 100A is independent from the electrode arrangement. For example, in some devices with comb electrode structures, a gap between respective electrodes may provide a ventilation path for the device, and the ventilation is, therefore, constrained and defined by the electrode arrangement. As diaphragm 150 is arranged over the gap between first electrode 110 and second electrode 120, ventilation considerations may be addressed by other aspects of microelectromechanical device 100A, e.g., by ventilation holes in diaphragm 150, thereby allowing the arrangement of first electrode 110 and second electrode 120 to be influenced by other factors (for example, fluidic damping, discussed below) and not constrained by ventilation aspects.

First electrode 110 and second electrode 120 may be formed from electrically conductive materials, e.g., a semiconductor, such as silicon or doped silicon, and/or a metal. The gap between first electrode 110 and second electrode 120 may be less than 5 µm, e.g., the gap may be 3 µm, i.e., the gap may be substantially 3 µm.

Figure 1B:
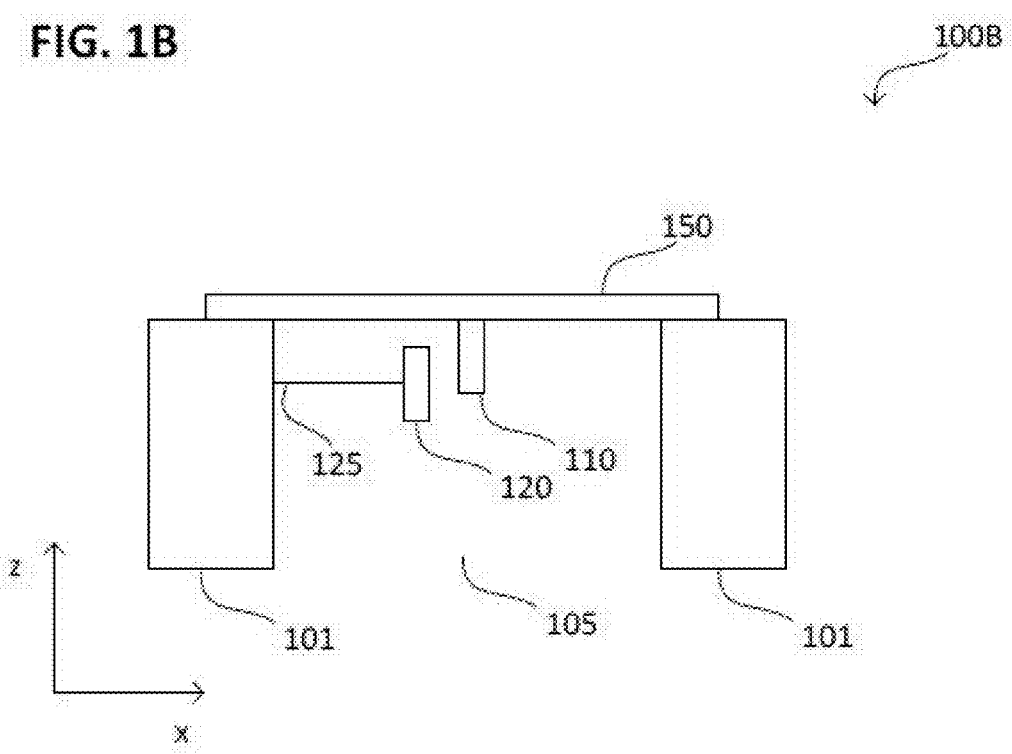

FIG. 1B shows microelectromechanical device 100B in cross-section. Microelectromechanical device 100B may be similar to microelectromechanical device 100A. However, as may be seen, diaphragm 150 may cover, or enclose, a cavity 105 in substrate 101; this arrangement may be called a closed diaphragm. Ventilation holes in diaphragm 150 may allow a fluid, in which microelectromechanical device 100B is located, to pass through diaphragm 150, for example, to equalize pressure on either side of diaphragm 150. Second electrode 120 may be indirectly mounted to the substrate 101, i.e., second electrode 120 may include a support structure 125 that mounts, or couples, second electrode 120 to substrate 101.

Figure 2A:
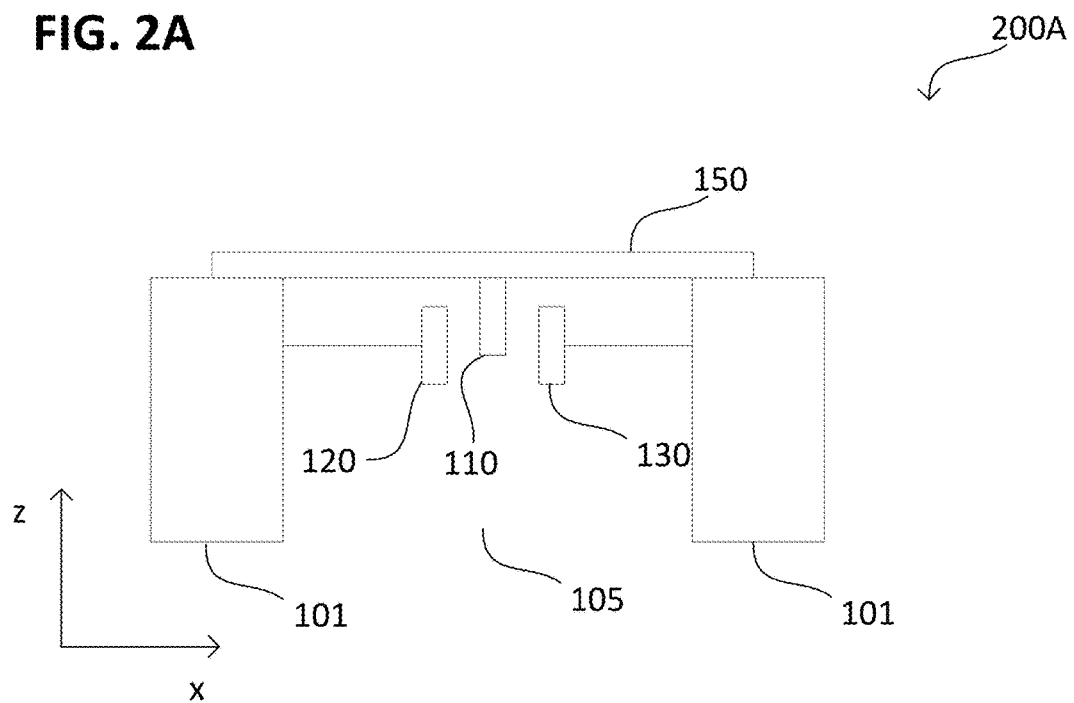
FIGS. 2A & 2B show a microelectromechanical device in cross-section.

FIG. 2A shows microelectromechanical device 200A in cross-section. Microelectromechanical device 200A may be similar to microelectromechanical devices 100A and 100B. Microelectromechanical device 200A may include a third electrode 130.

Third electrode 130 may be mounted to either the diaphragm 150 or the substrate 101 and may be laterally adjacent to first electrode 110 or second electrode 120, e.g., directly laterally adjacent to first electrode 110 or second electrode 120. Third electrode 130 may be an electrode finger of a plurality of first fingers of first electrode 110 or of a plurality of second fingers of second electrode 120 (discussed below).

Alternatively, third electrode 130 may be an additional electrode. For example, second electrode 120 and third electrode 130 may be coupled to one or more differential circuits to provide a true differential output, thereby increasing an electrical signal read out and improving linearity.

As shown in FIG. 2A, third electrode 130 may be mounted to substrate 101 and may be arranged laterally adjacent to first electrode 110, on a side of first electrode 110 opposite to second electrode 120. First electrode 110, second electrode 120, and third electrode 130, may all be arranged on the same side of diaphragm 150.

Figure 2B:
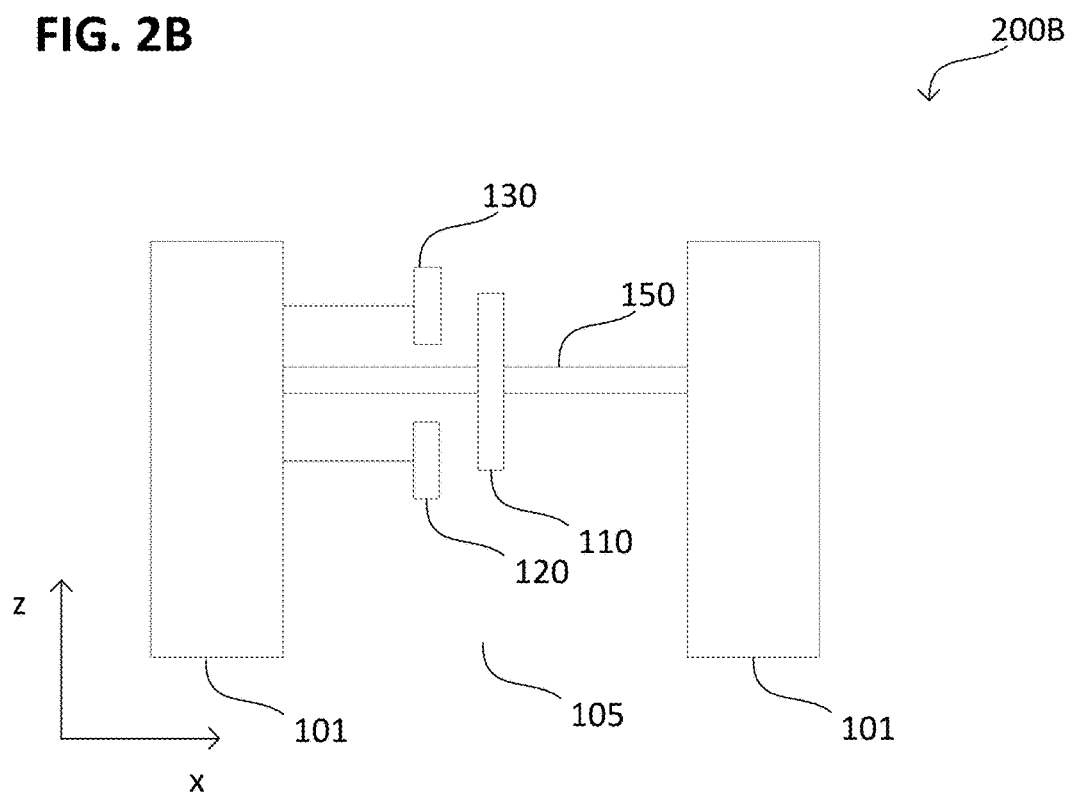

FIG. 2B shows microelectromechanical device 200B, which may be similar to microelectromechanical device 100A, 100B, and 200A. Here, however, second electrode 120 and third electrode 130 may be arranged on opposite sides of diaphragm 150. First electrode 110 may extend on either side of diaphragm 150 so that opposite ends of first electrode 110 are laterally adjacent to second electrode 120 and third electrode 130.

Figure 3:
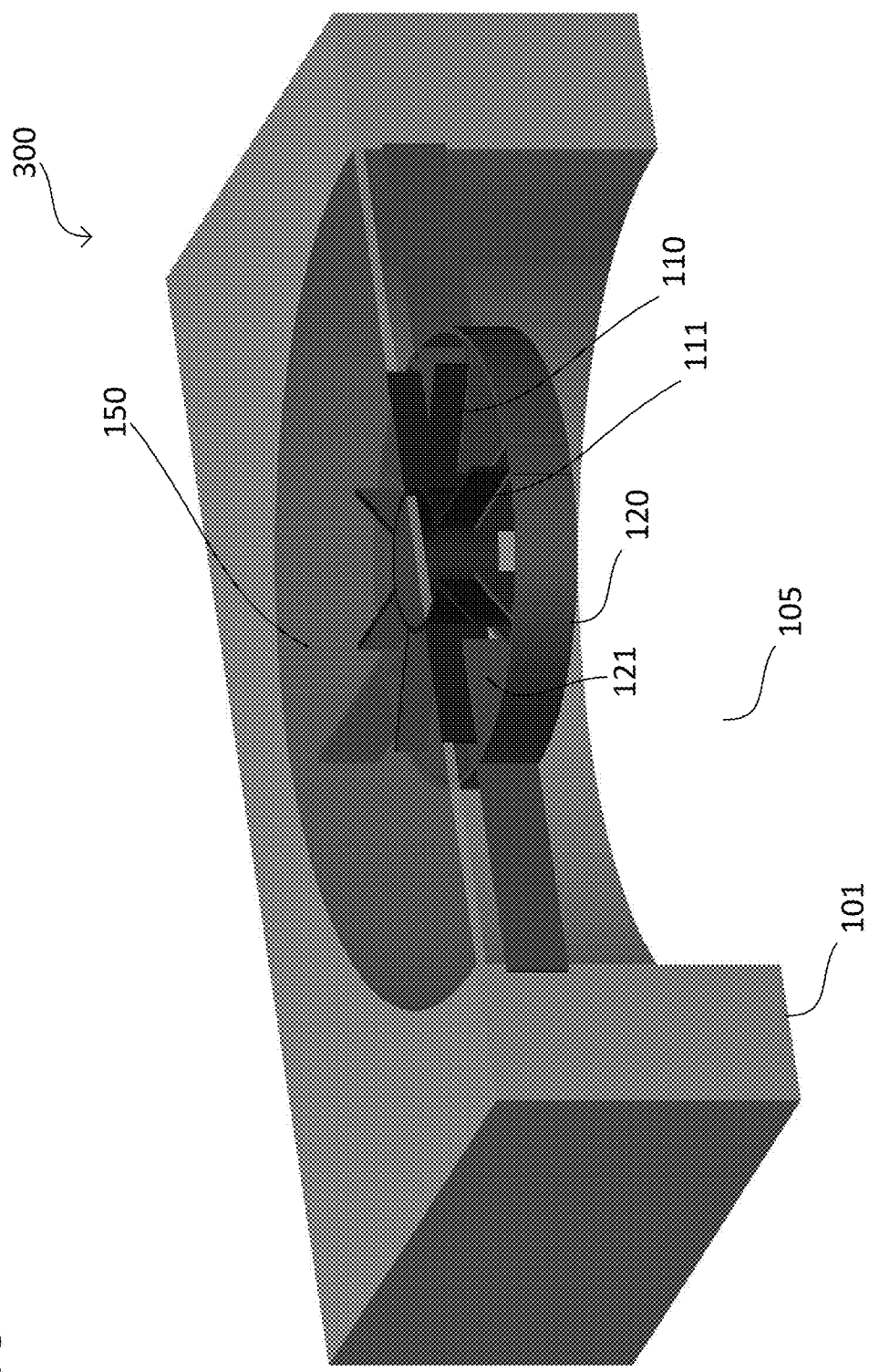
FIG. 3 shows a plan view of a microelectromechanical device in cross-section.

FIG. 3 shows microelectromechanical device 300 in cross-section. Microelectromechanical device 300 may be similar to microelectromechanical device 100A, 100B, 200A, and 200B. In an aspect of the disclosure, first electrode 110 may include a plurality of first fingers 111 (for clarity in FIG. 3, only one finger 111 is identified, however, each finger of first electrode 110 is one of the plurality of first fingers 111) and second electrode 120 may include a plurality of second fingers 121 (for clarity in FIG. 3, only one finger 121 is identified, however, each finger of second electrode 120 is one of the plurality of second fingers 121). Plurality of first fingers 111 and plurality of second fingers 121 are arranged in an interdigital manner. Increasing a number of first fingers 111 and second fingers 121 may increase a sensitivity of microelectromechanical device 300.

In other words, microelectromechanical device 300 may include a substrate 101; a diaphragm 150 mounted to the substrate 101; a comb electrode structure including: a dynamic electrode 110 (for example, first electrode 110 may be a dynamic electrode) mounted to the diaphragm 150, the dynamic electrode 110 including a plurality of dynamic fingers 111; a stator electrode 120 (for example, second electrode 120 may be a stator electrode 120) mounted to the substrate 101, the stator electrode 120 including a plurality of stator fingers 121; wherein the plurality of dynamic fingers 111 and the plurality of stator fingers 120 may be interdigitated (e.g., interlocked in an alternating manner, for example, with a gap or space between the fingers) and may be laterally adjacent to each other; and wherein the diaphragm 150 may be arranged over the plurality of dynamic fingers 111 and the plurality of stator fingers 121. Deflection of diaphragm 150 may cause dynamic electrode 110 to move in relation to stator electrode 120, which may be fixed to substrate 101, i.e., stator electrode 120 may be relatively static in comparison to deflection or movement of the diaphragm 150, and may provide a reference position that dynamic electrode 110 moves in reference to.

Figure 4A:
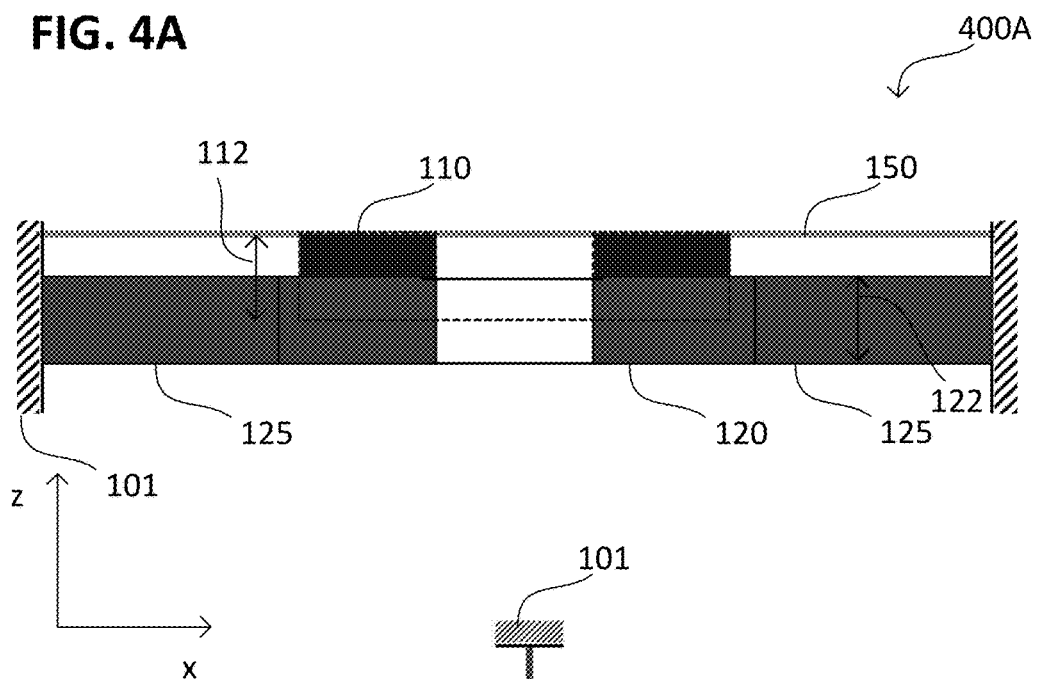
FIG. 4A-4D show side views and top views of electrode arrangements.

In an aspect of the disclosure, first electrode 110 may be arranged offset from second electrode 120 in the direction of the z-axis. FIG. 4A shows the relative arrangement 400A of first electrode 110 and second electrode 120 in a cross-sectional side-view. First electrode 110 may be arranged a first distance from diaphragm 150, second electrode 120 may be arranged a second distance from diaphragm 150, wherein the first distance is different (e.g., less than) the second distance. In other words, first electrode 110 and second electrode 120 are offset from each other in a vertical direction when the diaphragm 150 is in an equilibrium position.

A fraction of the lateral extension 112 of first electrode 110 may be laterally adjacent to a fraction of a vertical extension 122 of the second electrode 120, when the diaphragm is in an equilibrium position, for example, 50 percent of the lateral extension of each of the first electrode 110 and the second electrode 120 may be laterally adjacent to each other in the equilibrium position of diaphragm 150. This arrangement may extend the dynamic range of a microelectromechanical device, for example, when diaphragm 150 deflects in an upward direction along the z-axis, the alignment of overlapping areas of first electrode 110 and second electrode 120 is reduced, whereas when diaphragm 150 deflects in a downward direction along the z-axis, the alignment of overlapping areas of first electrode 110 and second electrode 120 is increased.

In addition, FIG. 4A may show first electrode 110 integral with diaphragm 150. That is, first electrode 110 may be formed as a monolithic part of diaphragm 150, e.g., from the same material.

Figure 4B:
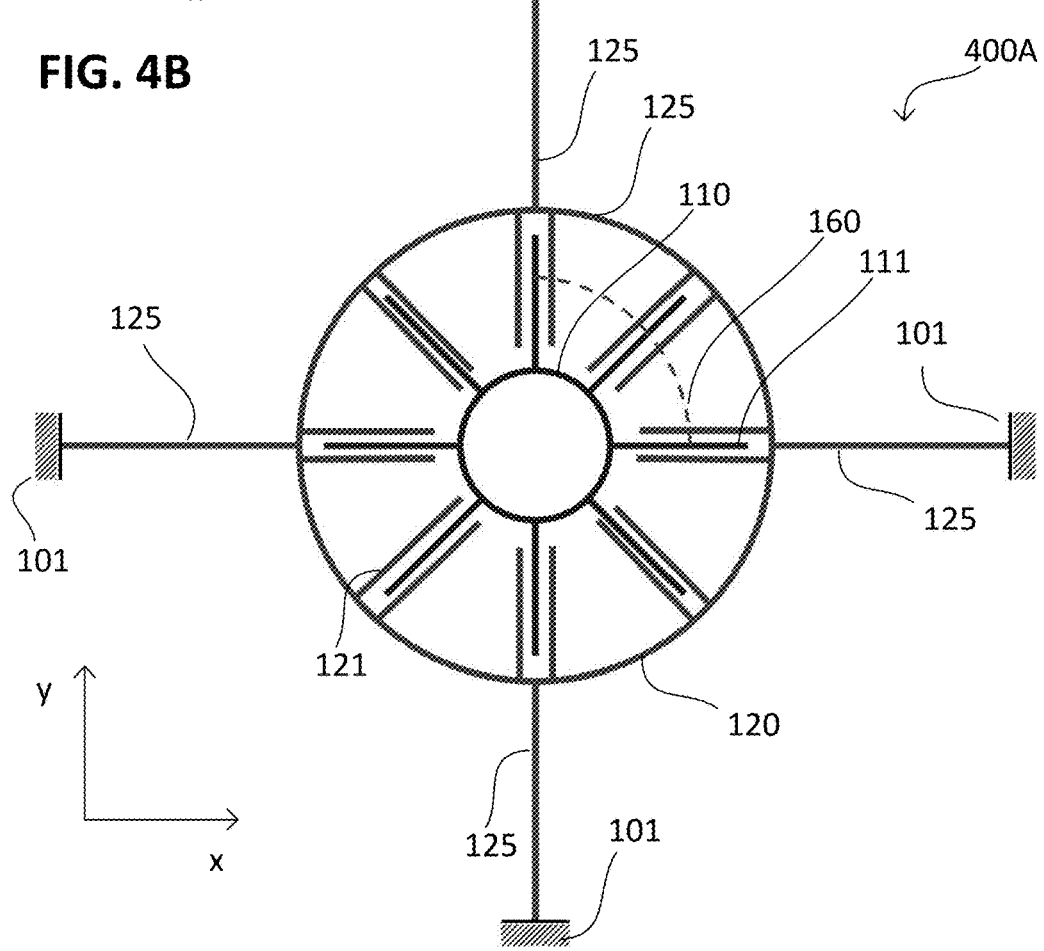

FIG. 4B may be a top view of arrangement 400A. As may be seen, second electrode 120 may include a support structure 125. The plurality of fingers 121 may extend or extrude from support structure 125. In addition, support structure 125 may couple second electrode 120 to substrate 101. Support structure 125 may include a ring-like structure and the plurality of second fingers 121 may extend from a circumference of the ring-like structure so that they are laterally adjacent to the plurality of first fingers 111. In addition, legs may extend from the ring-like structure to substrate 101, to couple second electrode 120 with the substrate 101.

Figure 4C:
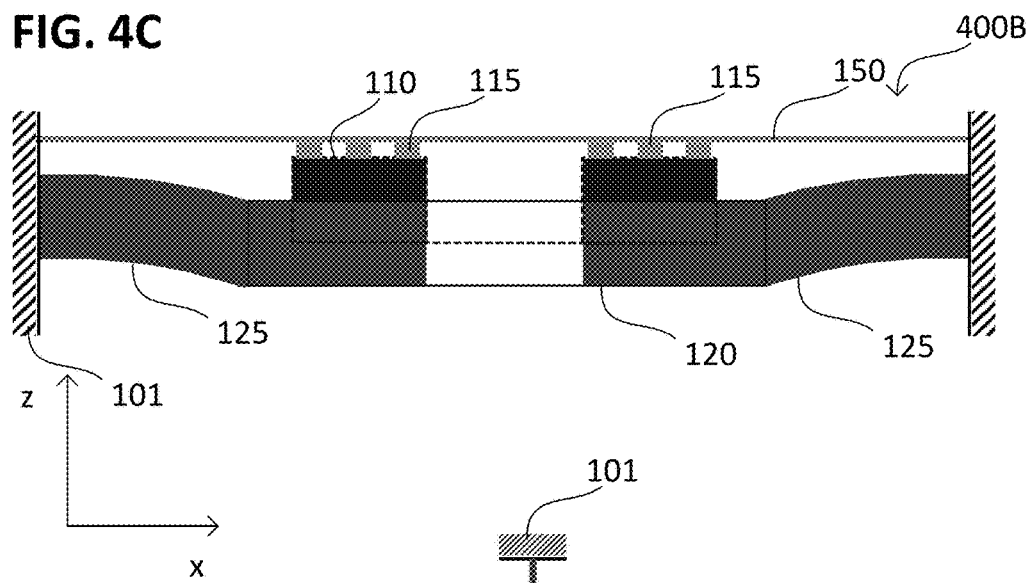

FIG. 4C may show the relative arrangement 400B of first electrode 110 and second electrode 120 in a cross-sectional side-view. Similar to the discussion of arrangement 400A above, first electrode 110 and second electrode 120 may be offset in a vertical direction.

In an aspect of the disclosure, first electrode 110 may be coupled to diaphragm 150 by at least one via 115. At least one via 115 may electrically contact first electrode 110 and may mechanically couple first electrode 110 to diaphragm 150.

In an aspect of the disclosure, support structure 125 may cause the offset between first electrode 110 and second electrode 120. For example, support structure 125 may include a plurality of layers. At least one layer may be pre-stressed which may cause support structure 125 to deflect in a vertical direction, e.g., downward, to achieve the offset.

Figure 4D:
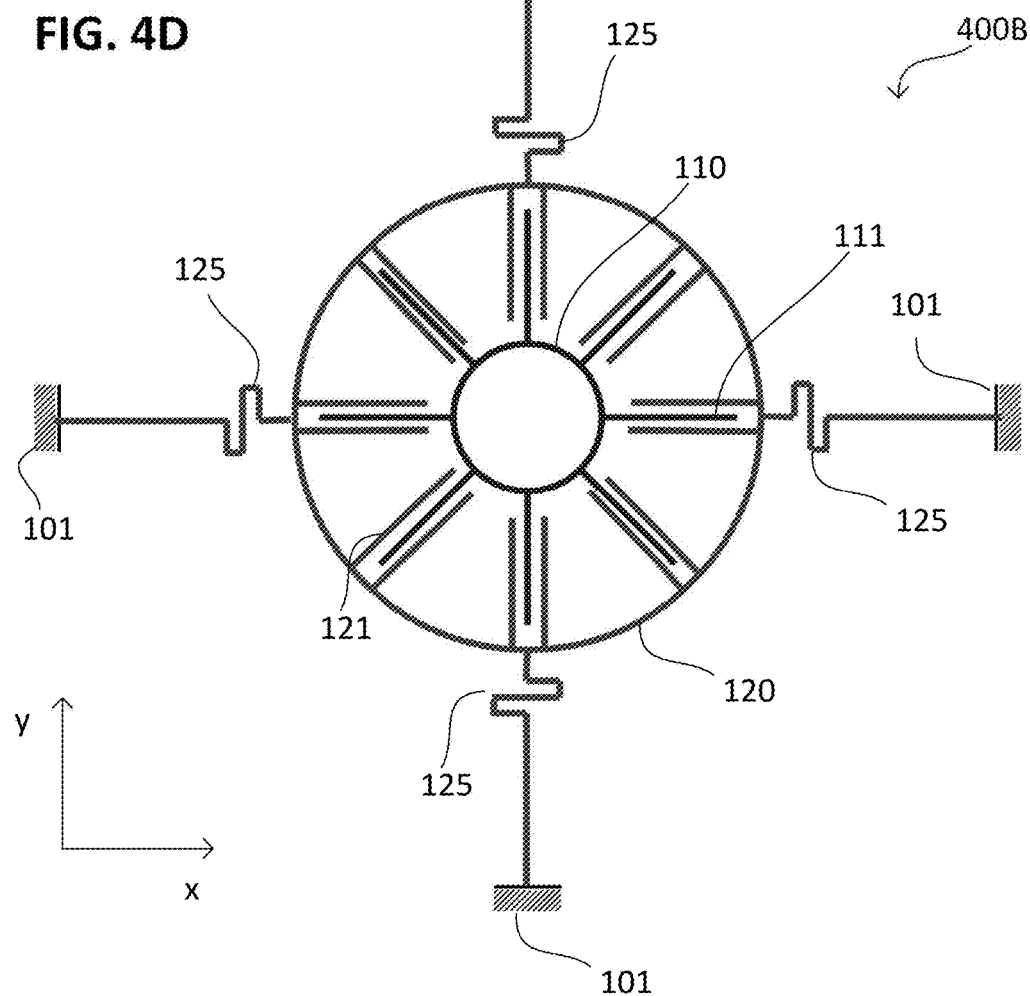

FIG. 4D may show arrangement 400B from a top view. Additionally or alternatively to FIG. 4C, support structures 125 may include a spring. The spring may cause the offset (or may further enlarge an offset) between first electrode 110 and second electrode 120, i.e., may cause second electrode 120 to deflect in a vertical direction. In addition, the springs in support structure 125 may isolate stresses in substrate 101 from electrode 120, e.g., diminish or eliminate distortion of second electrode 120 due to thermal variables and stress contributions from the environment.

FIG. 5A-5F may show top views of various arrangements of first electrode 110 and second electrode 120. Some figures may omit reference numeral 121 of the plurality of second fingers 121 for clarity. The plurality of fingers 121 may be the fingers depicted as connected with second electrode 120.

Figure 5A:
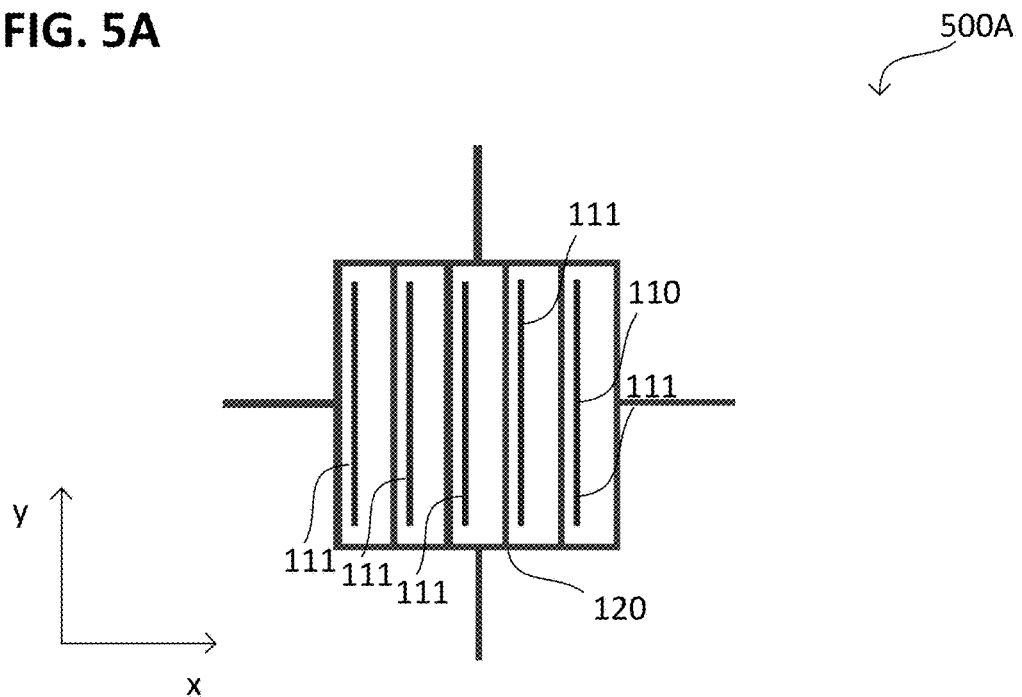
FIG. 5A-5F show top views of electrode arrangements.

FIG. 5A may show a top view of arrangement 500A in which each of the plurality of first fingers 111 and the plurality of second fingers 121 may be parallel with each other. The plurality of first fingers 111 may be alternatingly interdigitated with the plurality of second fingers 121. FIG. 5A may show an alternating profile of first electrode 110 and second electrode 120, however, the electrode arrangement may not be limited to the depicted profile as the first electrode 110 and second electrode 120 may have any geometric shape that may arranged in an alternating profile.

Figure 5B:
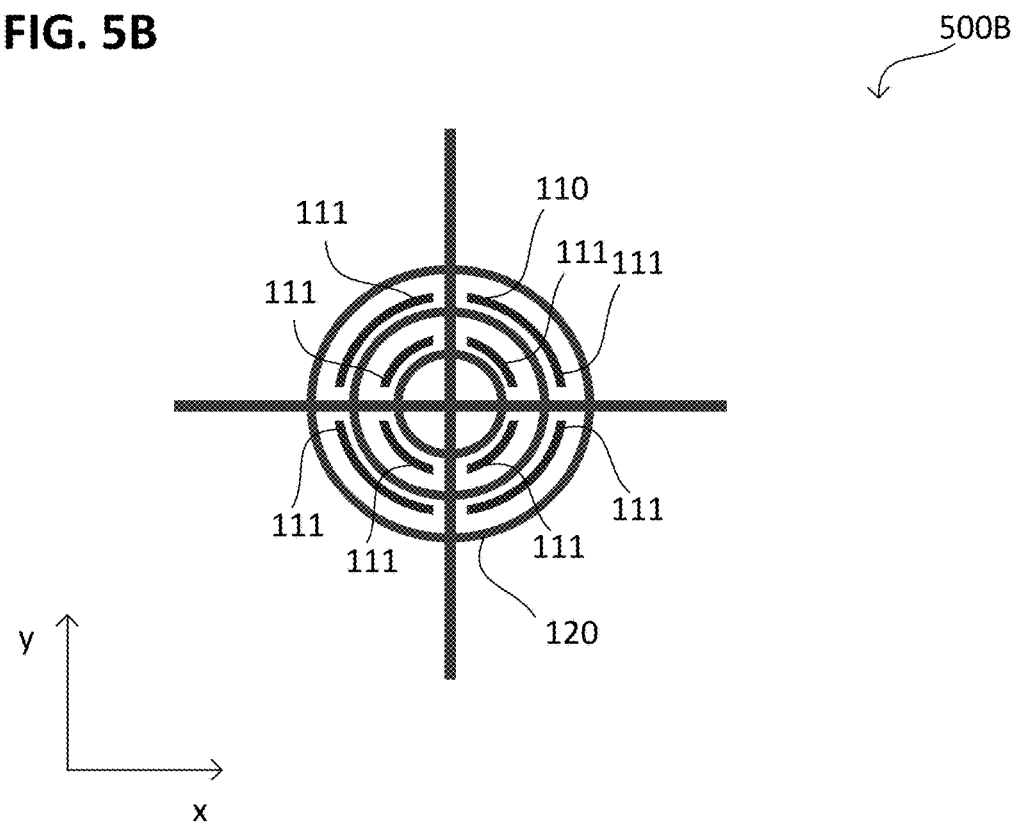

FIG. 5B may show a top view of arrangement 500B. The plurality of first fingers 111 and the plurality of second fingers 121 may be interdigitated in a concentric shell profile with respect to a common vertical axis. FIG. 5B may show a concentric circular shell profile of first electrode 110 and second electrode 120, however, the electrode arrangement is not limited in this respect as the first electrode 110 and second electrode 120 may have any geometric shape that may arranged in a concentric shell profile with respect to a common vertical axis. A concentric shell profile may indicate that the interdigitated fingers may have similar shapes and may be layered or nestled within one another so that going from a center point to the outermost finger, the dimensions of each finger may be larger than the last.

Figure 5C:
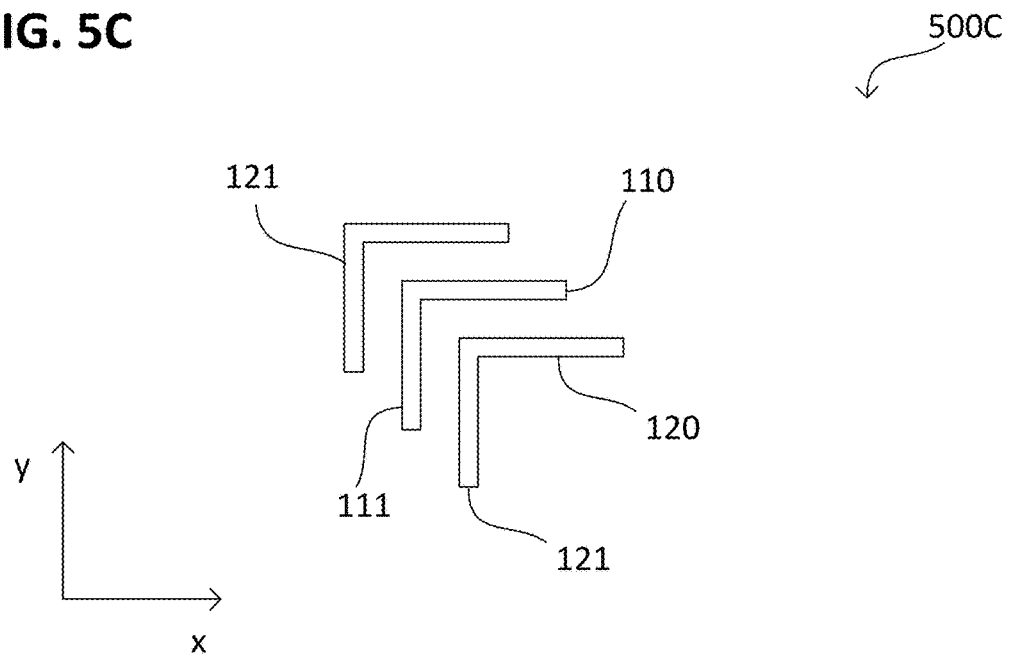
Figure 5D:
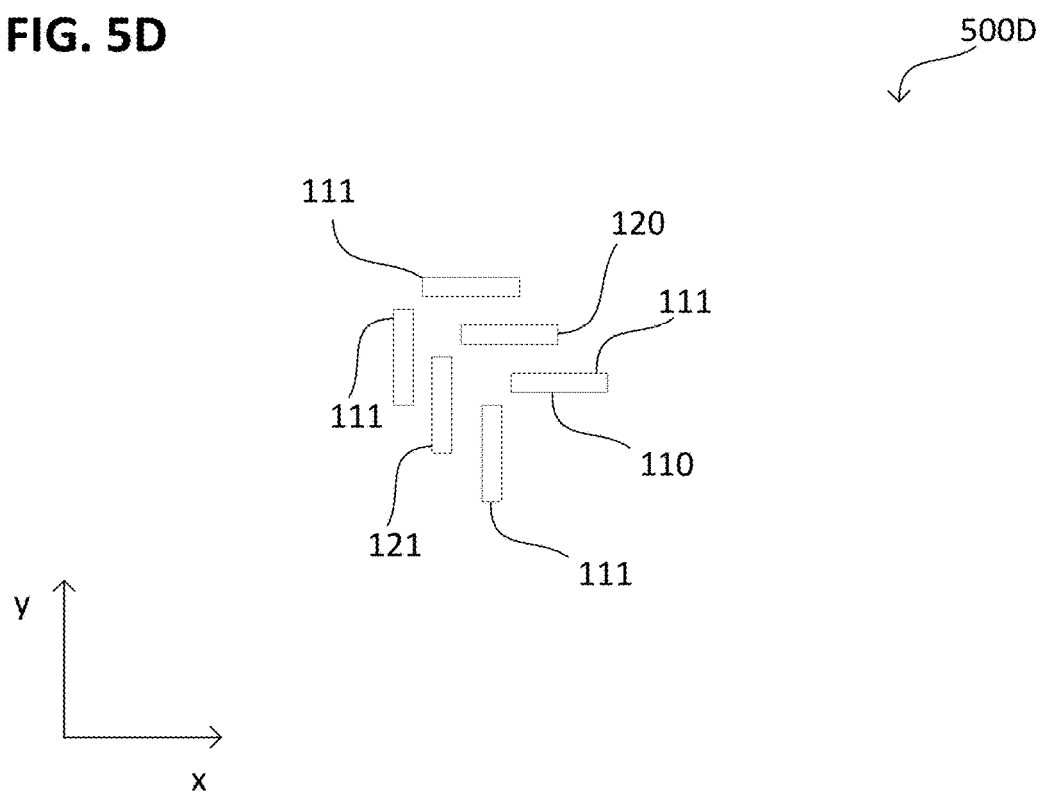

FIG. 5C may show a top view of arrangement 500C. Similar to arrangement 500B, first electrode 110 and second electrode 120 may each have fingers extending in two directions, in a first direction and in a second direction at an angle, e.g., perpendicular, to the first direction, e.g., as shown, in a direction along the x-axis and in a direction along the y-axis. This arrangement may allow a higher sensitivity in that movement of the first electrode 110 may be irregular, for example, not perfectly vertical, and may include some lateral movement that may be otherwise not-detected. Additionally or alternatively, first electrode 110 and second electrode 120 may not be perfectly aligned due to tolerancing or limitations of manufacturing technology, and arrangement 500C may address some of these issues. As shown in FIG. 5D, the plurality of fingers 111 of first electrode 110 and the plurality of fingers 121 of second electrode 120 in arrangement 500D may be arranged with separate extensions in the first direction and the second direction as discussed in reference to FIG. 5C.

Figure 5E:
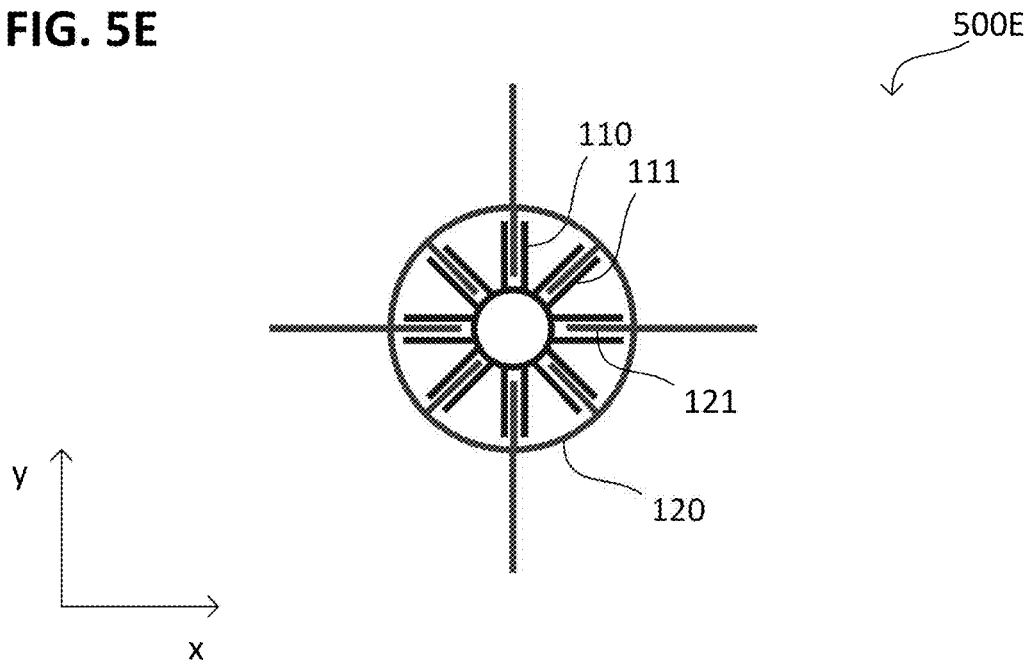

FIG. 5E may show arrangement 500E. In arrangement 500E, each first finger 111 of the plurality of first fingers 111 and each second finger 121 of the plurality of second fingers 121 may be arranged radially with respect to a common vertical axis. Plurality of first fingers 111 and plurality of second fingers 121 may be arranged, for example, as spokes of a wheel.

In an aspect of the disclosure, each second finger 121 of the plurality of second fingers 121 may have a first finger 111 laterally adjacent to opposite sides of each finger 121, i.e., a first finger 111 may be on either side of a lateral extension of each second finger 121.

Figure 5F:
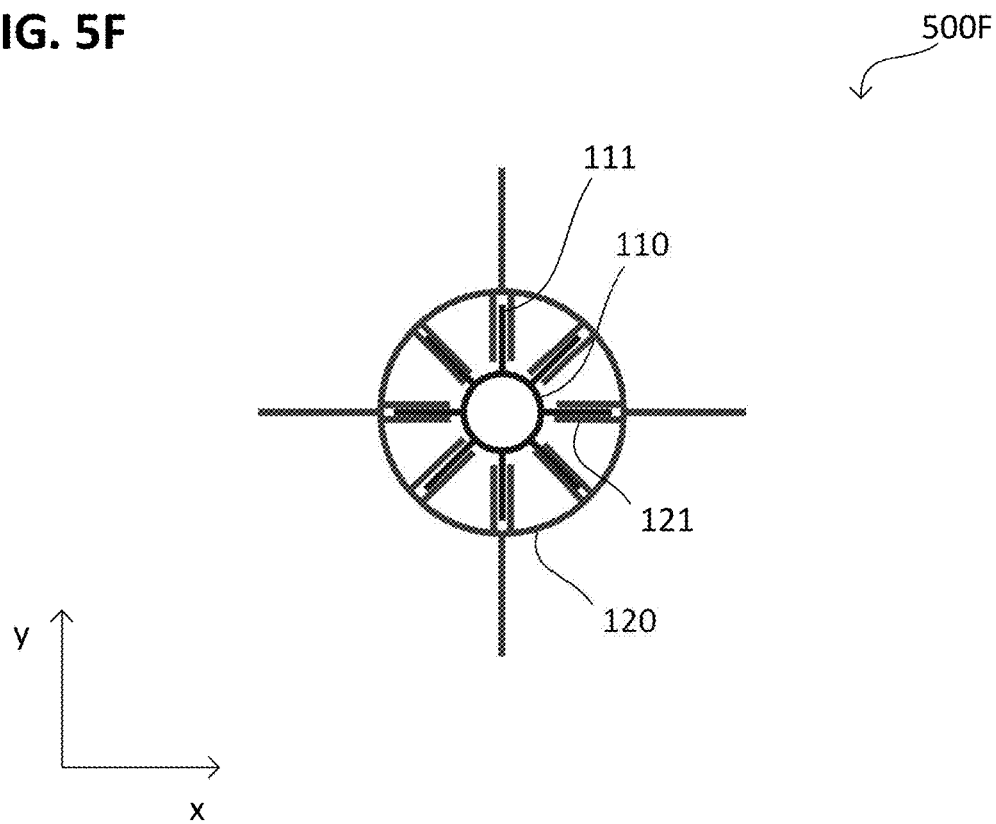

FIG. 5F may show arrangement 500F of first electrode 110 and second electrode 120. Similar to arrangement 500E, each first finger 111 of the plurality of first fingers 111 and each second finger 121 of the plurality of second fingers 121 may be arranged radially with respect to a common vertical axis. In comparison to arrangement 500E, however, each first finger 111 of the plurality of first fingers 111 may have a second finger 121 laterally adjacent to opposite sides of each first finger 111, i.e., a second finger 121 may be on either side of a lateral extension of each first finger 111.

In an aspect of the disclosure, FIG. 6A-6F may show various cross-sectional arrangements of first electrode 110 and second electrode 120 along a line 160 indicated in FIG. 4B. As discussed above, the first electrode 110 may include a plurality of first fingers 111 and the second electrode 120 may include a plurality of second fingers 121. First electrode 110 is mounted to the diaphragm 150, so the plurality of first fingers 111 form part of the first electrode 110. The plurality of fingers 121 of the second electrode 120 are connected to substrate 101, which may be not shown in FIG. 6A-6F. Likewise, some references identifying a particular finger as part of first electrode 110 or second electrode 120 may be omitted for clarity, however, the type of finger may be readily identified by whether or not it is connected to the diaphragm 150, as discussed above.

Figure 6A:
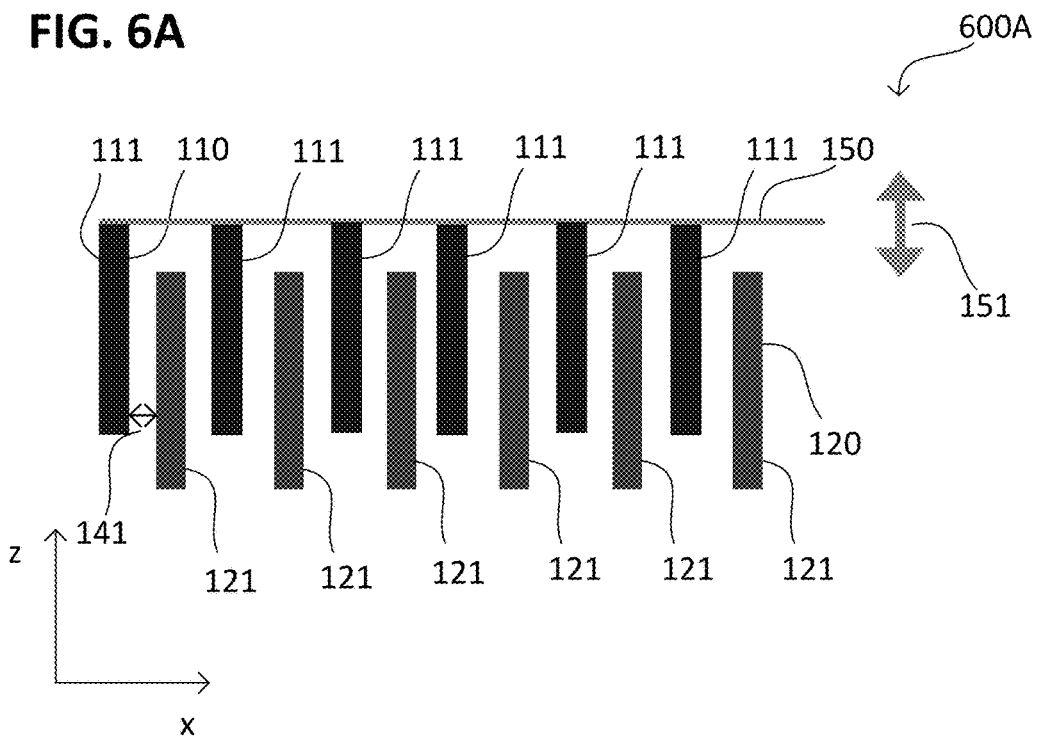
FIG. 6A-6F show side views of electrode arrangements in cross-section.

FIG. 6A may show a cross-sectional view of arrangement 600A of first electrode 110 and second electrode 120. Arrow 151 may indicate the general direction of deflection of diaphragm 150. Each finger 111 of the plurality of first fingers 111 and each finger 121 of the plurality of second fingers 121 may be equidistant to one another. This may be illustrated by gap 141, which may have the same distance between each finger in arrangement 600A. Gap 141 may be less than 5 µm, e.g., the gap may be 3 µm, i.e., the gap may be substantially 3 µm. Arrangement 600A may include the maximum number of a plurality of fingers 111 and a plurality of fingers 121 in a given region.

Figure 6B:
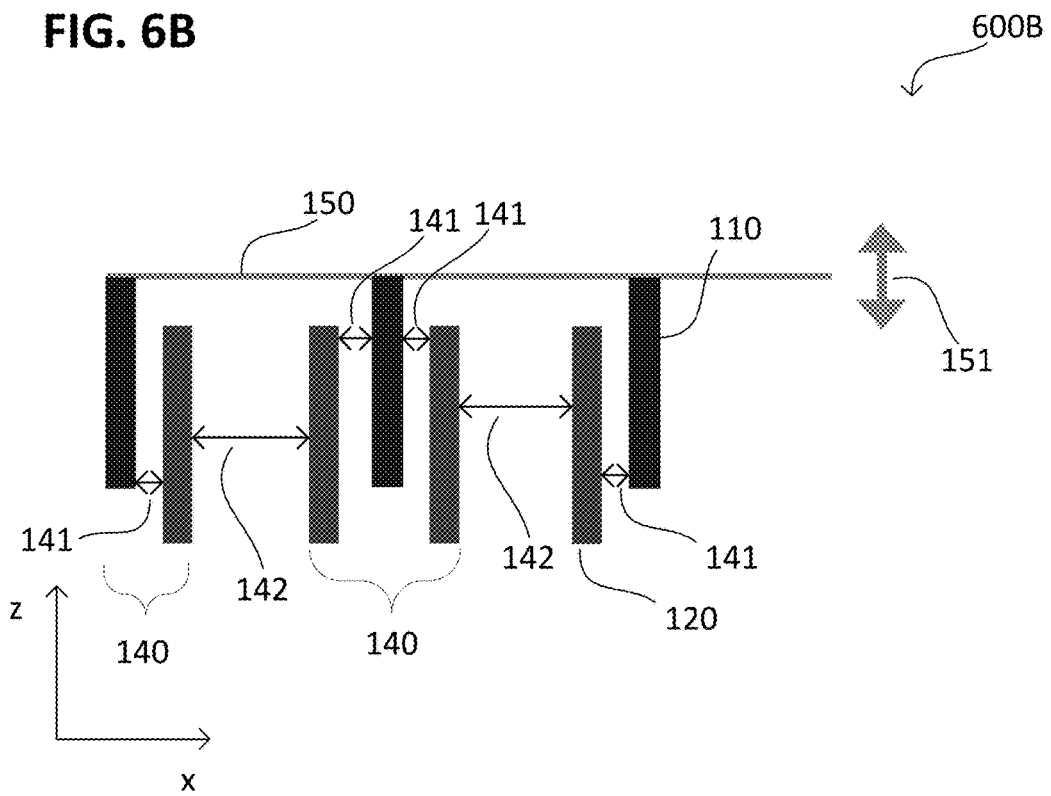

FIG. 6B may show a cross-sectional view of arrangement 600B of first electrode 110 and second electrode 120. The plurality of first fingers 111 and the plurality of second fingers 121 may include adjacent fingers having a first distance 141 between each other and further adjacent fingers having a second distance 142 between each other, wherein the first distance 141 is different from the second distance 142, e.g., first distance 141 may be less than second distance 142. As discussed above, gap 141 may be less than 5 µm, e.g., the gap may be 3 µm, i.e., the gap may be substantially 3 µm and gap 142 may be in a range of 2 µm to 60 µm, e.g., a range of 5 µm to 52 µm.

As may be seen in FIG. 6B, a grouping 140 may include at least one finger 111 of the plurality of first fingers 111 and at least one finger 121 of the plurality of second fingers 121. For example, a grouping 140 may include one finger 111 and one finger 121 or a grouping may include one finger 111 with two fingers 121 flanking the one finger 111 (arranged laterally adjacent on opposite sides of finger 111). Within a grouping 140, the fingers may have a gap 141 between one another. From grouping 140 to grouping 140, however, the gap may be gap 142.

In other words, each finger 111 of the plurality of dynamic fingers 111 and each finger 121 of the plurality of stator fingers 121 may be arranged in a plurality of groupings 140, wherein each dynamic finger 111 within a respective grouping 140 of the plurality of groupings 140 may be arranged a first distance (e.g., gap 141) from a stator finger 121 within the respective grouping 140, and wherein each grouping 140 may be arranged a second distance (e.g., gap 142) from other groupings 140 of the plurality of groupings 140, wherein the first distance is less than the second distance.

In an aspect of the disclosure, third electrode 130 (see microelectromechanical device 200A and 200B above) may be arranged in a similar fashion to arrangement 600B. The gap between the first electrode 110 and the second electrode 120 may be less than a distance from the first electrode 110 to the third electrode 130 and a distance from the second electrode 120 to the third electrode 130. For example, first electrode 110 and second electrode 120 may form a grouping 140, with a gap 141 between the first electrode 110 and the second electrode 120, while the third electrode 130 may be arranged a gap 142 from the grouping, i.e., third electrode 130 may be laterally offset from the first electrode 110 and the second electrode 120 so the gaps between the electrodes are not equidistant.

Figure 6C:
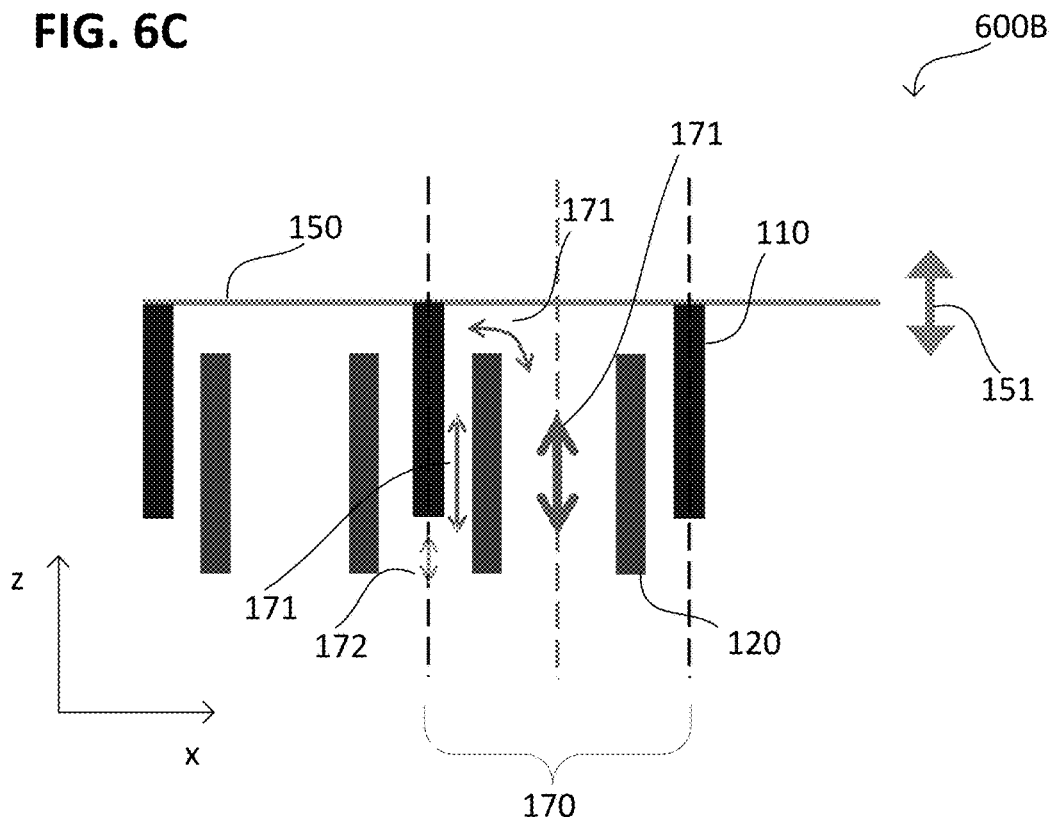
Figure 6D:
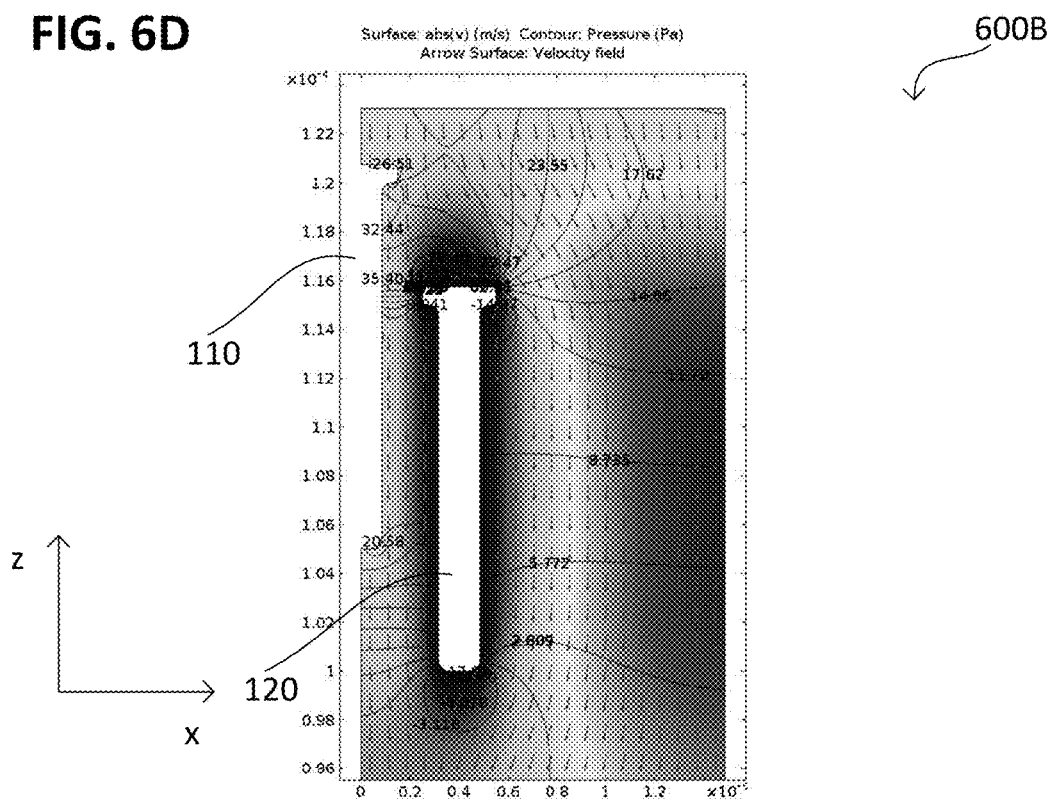

FIG. 6C may illustrate an aspect of the disclosure of arrangement 600B. Region 170 may indicate an air flow channel between two fingers 111 of the plurality of first fingers 111 of first electrode 110. In comparison to an arrangement of fingers at equidistant positions, arrangement 600B may have a superior signal to noise ratio as damping of a fluid surrounding the microelectromechanical device may be reduced. As indicated by arrow 151, diaphragm 150 may deflect in a substantially vertical direction, which may displace a fluid surrounding diaphragm 150, or cause a fluid surrounding diaphragm 150 to flow.

Arrows 171 indicate regions of fluid flow around fingers 111 and fingers 121. The greatest fluid flow may be in the center of region 170 (gap 142) due to the larger gap size between fingers, e.g., here, between two fingers 121. Arrow 172 may indicate a general direction of movement of a finger 111 of the plurality of first fingers 111. Further effects including absolute velocity, pressure, and velocity field in arrangement 600B, may be seen in FIG. 6D.

Figure 6E:
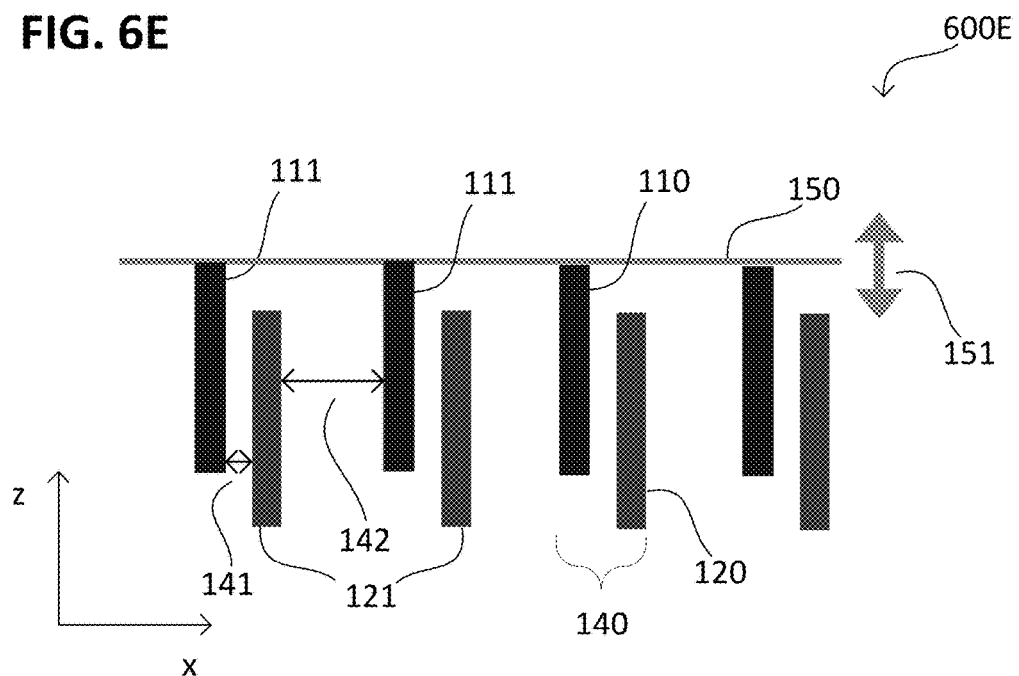

FIG. 6E may show a cross-sectional view of arrangement 600E of first electrode 110 and second electrode 120. Arrangement 600F may also reduce fluidic damping and thus improve signal to noise ratio. Each first finger 111 of the plurality of first fingers 111 may be arranged off-centered between two second fingers 121 of the plurality of second fingers 121. Therefore, each finger in arrangement 600F may not be equidistant from one another. For example, one finger 111 and one finger 121 may form a grouping 140. Within the grouping 140, one first finger 111 and one second finger 121 may have a gap 141, whereas between groupings 140, there may be a gap 142. Gaps 142 may provide channels for improved, or less impeded, fluid flow, which may reduce damping of the movement of first electrode 110 in relation to second electrode 120.

Figure 6F:
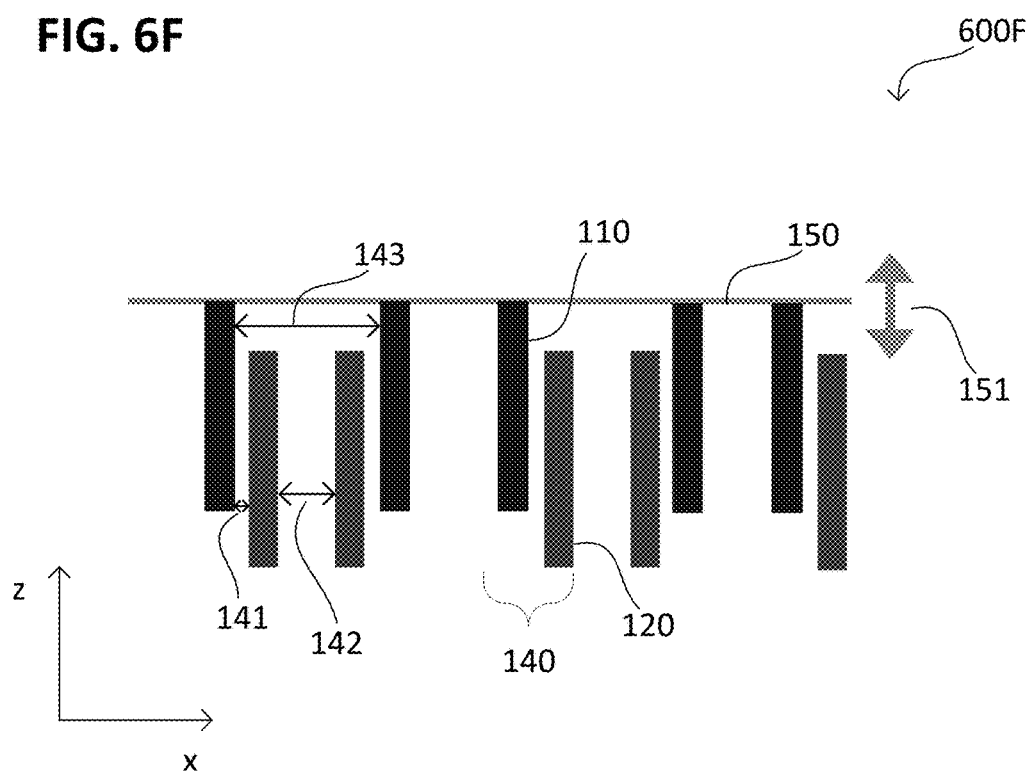

FIG. 6F may show a cross-sectional view of arrangement 600F of first electrode 110 and second electrode 120. In arrangement 600F, the plurality of first fingers 111 and the plurality of second fingers 121 may include at least one pair of first fingers 111 of the plurality of first fingers 111 adjacent to each other and at least one pair of second fingers 121 of the plurality of second fingers 121 adjacent to each other. In other words, a pair of first fingers 111 may be arranged laterally adjacent to a pair of second fingers 121 in an alternating fashion. Between a first finger 111 and a second finger 121 may be a gap 141. Between two second fingers 121 may be a gap 142, and between two first fingers 111 may be a gap 143. Gap 141 may be smaller than gap 142 and gap 143. Gap 142 may be smaller than gap 143. Gaps 142 and gaps 143 may provide channels for improved, or less impeded, fluid flow, that may reduce damping of the movement of first electrode 110 in relation to second electrode 120.

Figure 7:
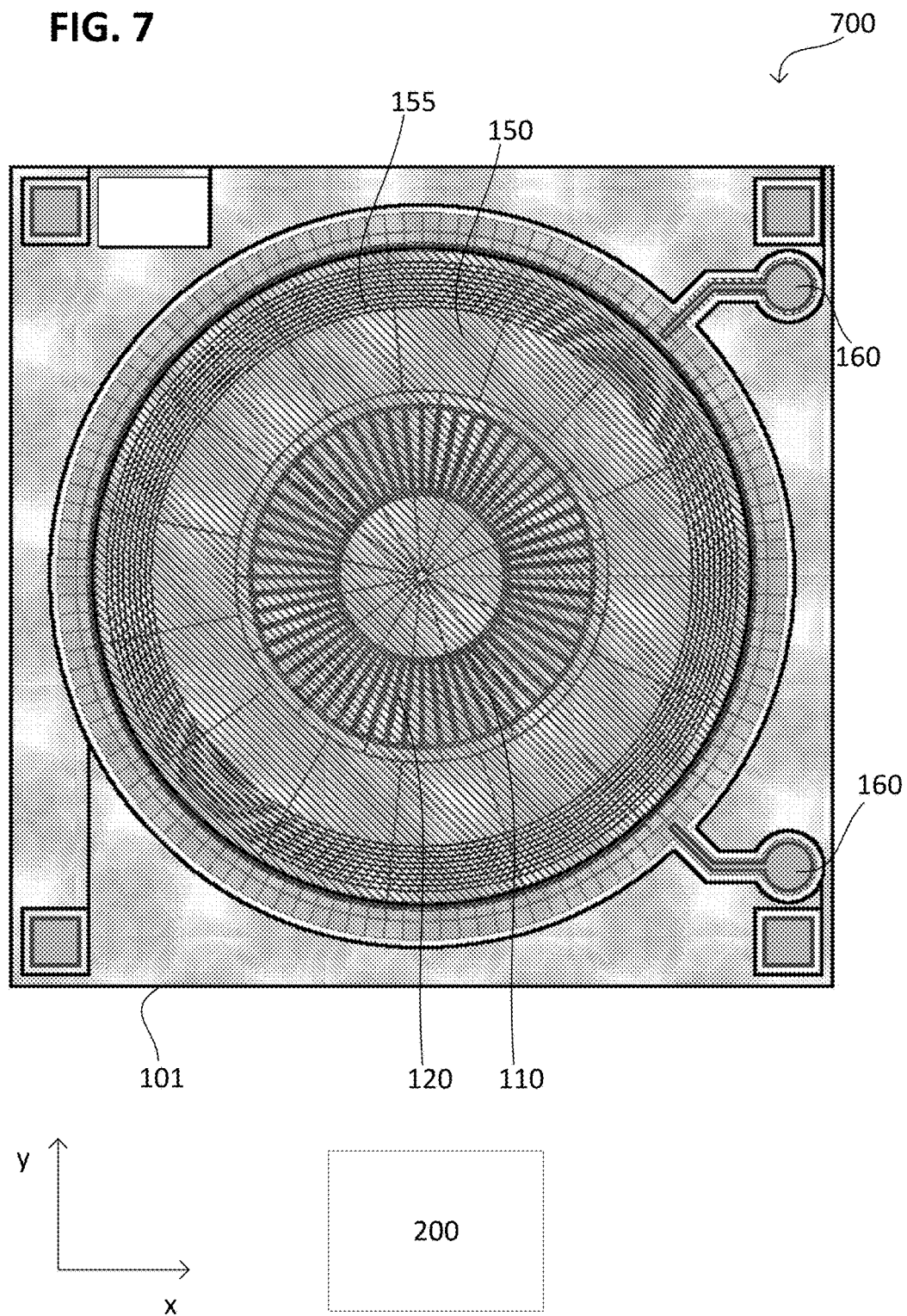
FIG. 7 shows a top view of a microelectromechanical system.

FIG. 7 may show a top view of a microelectromechanical device 700. Microelectromechanical device 700 may be similar to microelectromechanical device 100A, 100B, 200A, 200B, and 300. Microelectromechanical device may have a size in the range of 0.5 mm to 1.5 mm by 0.5 mm to 1.5 mm, e.g., 1.0 mm by 1.0 mm. Diaphragm 150 may be mounted on substrate 101 and may include corrugation 155 to improve flexibility of diaphragm 150. Diaphragm 150 may include any number of concentric corrugation rings, e.g., a plurality of rings. First electrode 110 and second electrode 120 may be seen in outline below diaphragm 150. In addition, microelectromechanical device 700 may include contact pads 160, which may be electrically coupled to first electrode 110, second electrode 120, or other electrical components of microelectromechanical device 700.

Microelectromechanical device 700 may include a circuit 200 electrically coupled to the first electrode 110 and the second electrode 120 (for example, via contact pads 160), the circuit 200 configured to detect a movement of the first electrode 110 and the second electrode 120 relative to each other and to output a signal representing the movement. Circuit 200 may be located on or in substrate 101 or may be arranged adjacent to microelectromechanical device 700, for example, circuit 200 may be arranged on a printed circuit board (PCB) or other suitable substrate, and microelectromechanical device 700, may also be arranged on the PCB. Circuit 200 may be laterally and/or vertically adjacent to microelectromechanical device 700.

Figure 8A:
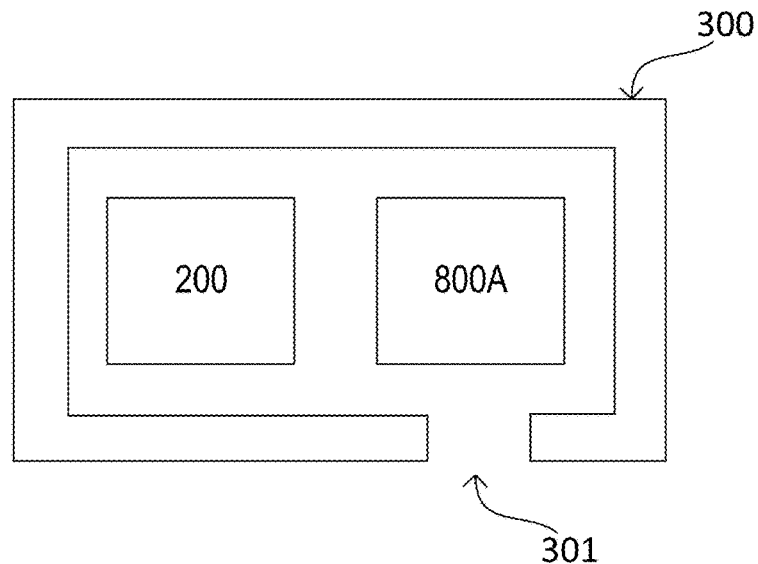
FIG. 8A shows a cross-sectional side view of a microelectromechanical package.

FIG. 8A may show a microelectromechanical system 800A including a microelectromechanical device 800A according to this disclosure (e.g., microelectromechanical device 100A, 100B, 200A, 200B, 300, and 700) and a circuit 200. The circuit may be further configured to provide a polarization voltage to the microelectromechanical device 800A, e.g., circuit 200 may provide a potential to at least one of first electrode 110 and second electrode 120. The microelectromechanical device 800A and the circuit may be at least partially enclosed in a package 300, the package having an opening 301 (e.g., a port) below the diaphragm (e.g., diaphragm 150) of the microelectromechanical device 800A. Opening 301 may allow environmental access for the microelectromechanical system 800A. For example, a fluid surrounding microelectromechanical system 800A may be able to access microelectromechanical device 800A via opening 301. In addition, mechanical waves, e.g., pressure waves, may also access microelectromechanical device 800A via opening 301.

Figure 8B:
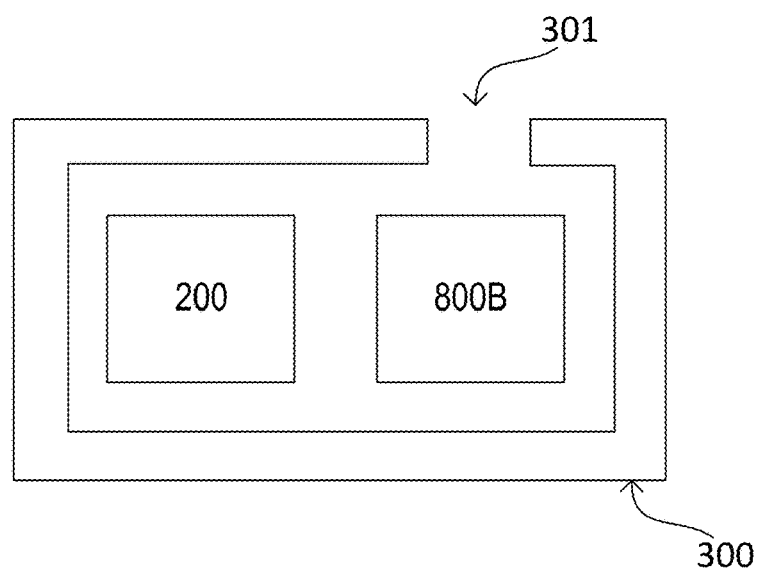
FIG. 8B shows a cross-sectional side view of a microelectromechanical package.

FIG. 8B may show a microelectromechanical system 800B including a microelectromechanical device 800B according to this disclosure (e.g., microelectromechanical device 100A, 100B, 200A, 200B, 300, and 700) and a circuit 200. The circuit may be further configured to provide a polarization voltage to the microelectromechanical device 800B, e.g., circuit 200 may provide a potential to at least one of first electrode 110 and second electrode 120. The microelectromechanical device 800B and the circuit may be at least partially enclosed in a package 300, the package having an opening 301 (e.g., a port) above the diaphragm (e.g., diaphragm 150) of the microelectromechanical device 800B. Opening 301 may allow environmental access for the microelectromechanical system 800AB For example, a fluid surrounding microelectromechanical system 800B may be able to access microelectromechanical device 800B via opening 301. In addition, mechanical waves, e.g., pressure waves, may also access microelectromechanical device 800B via opening 301.

Figure 9:
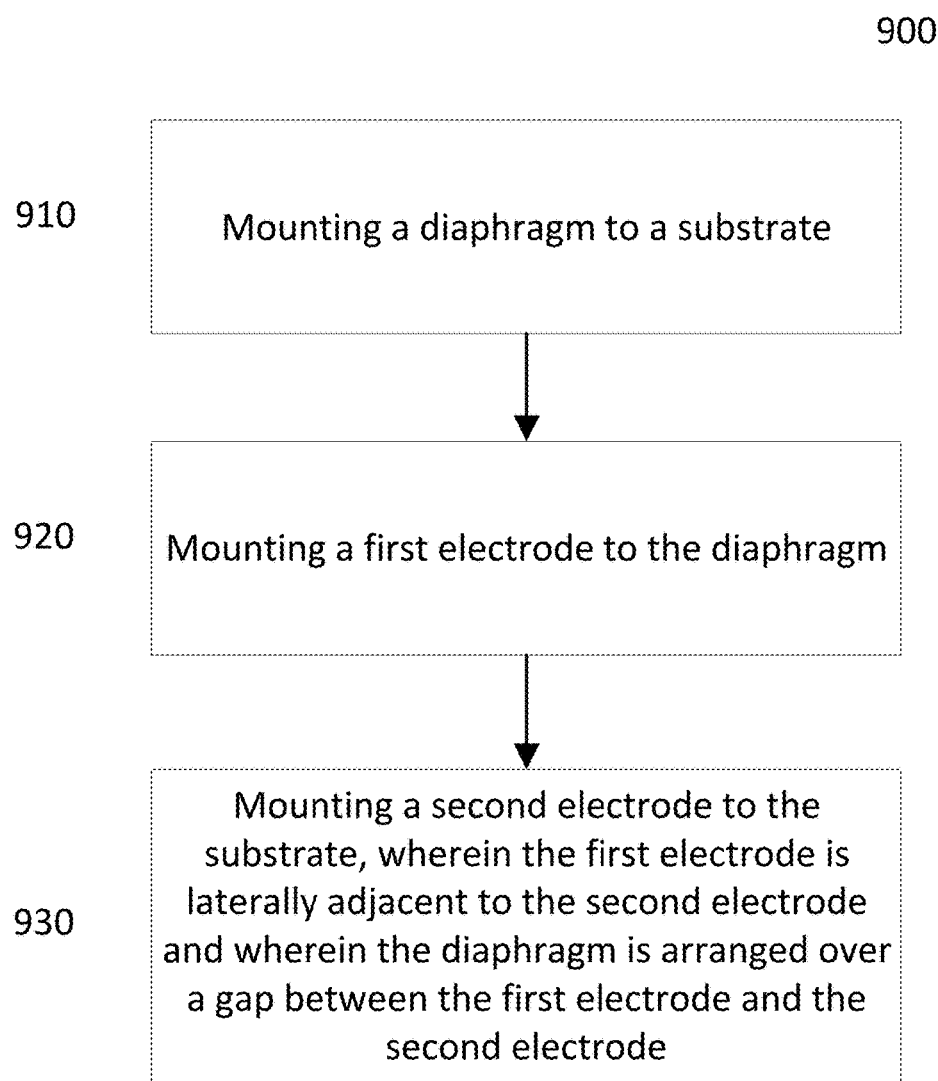
FIG. 9 shows a diagram of a method of manufacturing a microelectromechanical device.

FIG. 9 may show a method 900 of manufacturing a microelectromechanical device. Method 900 may include: mounting a diaphragm to a substrate 910; mounting a first electrode to the diaphragm 920; and mounting a second electrode to the substrate, wherein the first electrode is laterally adjacent to the second electrode, and wherein the diaphragm is arranged over a gap between the first electrode and the second electrode 930. Method 900 may be utilized to manufacture microelectromechanical device 100A, 100B, 200A, 200B, 300, 700, 800A, and 800B, according to any aspect of the disclosure.

Method 900 may further include coupling a circuit to the first electrode and the second electrode, the circuit configured to detect a movement of the first electrode and the second electrode relative to each other and to output a signal representing the movement. The circuit may be arranged in the substrate. Additionally or alternatively, the circuit may be arranged adjacent (laterally and/or vertically) to the microelectromechanical device. For example, coupling the circuit to the first electrode and the second electrode may further include mounting the microelectromechanical device on a substrate and mounting the circuit on the substrate.

Mounting a diaphragm to a substrate 910 may further include forming at least one ventilation hole in the diaphragm. In another aspect of the disclosure, mounting the diaphragm to a substrate 910 may further include structuring the diaphragm, e.g., forming at least one corrugation in the diaphragm.

Mounting a first electrode to the diaphragm 920 may further include forming at least one via between the first electrode and the diaphragm. The via may be formed from an electrically conductive material. For example, a layer, such as a dielectric layer, may be formed over the first electrode. At least one recess may be formed in the layer. The recesses may be filled with an electrically conductive material. The diaphragm may be formed over the first electrode and the at least one via so that the at least one via is in contact (e.g., physical contact) with the diaphragm.

Mounting the second electrode to the substrate 930 may further include forming a resilient structure, e.g., a spring, to couple the second electrode to the substrate. Additionally or alternatively, mounting the second electrode to the substrate 930 may further include forming a structure that couples the second electrode to the substrate, wherein the structure is pre-stressed to displace the second electrode in a vertical direction (as discussed above). For example, forming the second electrode may include forming a layer and forming a pre-stressed layer (e.g., a layer having a stress gradient) over the layer. The layer may be an electrically conductive material and/or a dielectric material. The pre-stressed layer may be an electrically conductive material and/or a dielectric material.

In another aspect of the disclosure, mounting the second electrode to the substrate 930 may further include releasing the first electrode and the second electrode or forming a trench between the first electrode and the second electrode. For example, a sacrificial region may be formed between the first electrode and the second electrode (as well as the third electrode) and the sacrificial region may be removed.

In an aspect of the disclosure, a package may be formed at least partially enclosing the microelectromechanical device and the circuit. The package may be formed from materials that passivate the microelectromechanical device and the circuit from an external environment, e.g., an encapsulant may protect from moisture. In addition, forming the package may include forming an opening (e.g., a port) in the package to allow functionality of the microelectromechanical device. For example, the opening may allow an incident sound wave to actuate a diaphragm of the microelectromechanical device. The opening may be formed above and/or below the diaphragm.

In an Example 1 of an aspect of the disclosure, a microelectromechanical device may include: a substrate; a diaphragm mounted to the substrate; a first electrode mounted to the diaphragm; a second electrode mounted to the substrate; wherein the first electrode is laterally adjacent to the second electrode; and wherein the diaphragm is arranged over a gap between the first electrode and the second electrode.

Example 2 may include the microelectromechanical device of Example 1, wherein the gap is three micrometers.

Example 3 may include the microelectromechanical device of any one of Examples 1 and 2, wherein the substrate is formed from a semiconductor.

Example 4 may include the microelectromechanical device of Example 3, wherein the semiconductor is silicon.

Example 5 may include the microelectromechanical device of any one of Examples 1-3, wherein the diaphragm is formed from an electrically conductive material.

Example 6 may include the microelectromechanical device of Example 5, wherein the electrically conductive material is a metal.

Example 7 may include the microelectromechanical device of Example 6, wherein the electrically conductive material is a semiconductor.

Example 8 may include the microelectromechanical device of Example 7, wherein the semiconductor is silicon.

Example 9 may include the microelectromechanical device of Example 8, wherein the silicon is a polycrystalline silicon.

Example 10 may include the microelectromechanical device of any one of Examples 1-9, wherein the substrate further may include a cavity.

Example 11 may include the microelectromechanical device of Example 10, wherein the second electrode is arranged in the cavity and the first electrode is at least partially located within the cavity.

Example 12 may include the microelectromechanical device of any one of Examples 10 and 11, wherein the diaphragm covers the cavity.

Example 13 may include the microelectromechanical device of any one of Examples 1-13, which further may include: a third electrode mounted to either the diaphragm or the substrate, wherein the third electrode is laterally adjacent to the first electrode or the second electrode.

Example 14 may include the microelectromechanical device of Example 13, wherein the third electrode is arranged within the cavity.

Example 15 may include the microelectromechanical device of Example 13, wherein the third electrode is arranged above the cavity.

Example 16 may include the microelectromechanical device of any one of Examples 13-15, wherein the gap between the first electrode and the second electrode is less than a distance from the first electrode to the third electrode and a distance from the second electrode to the third electrode.

Example 17 may include the microelectromechanical device of any one of Examples 13-16, wherein the third electrode is formed from an electrically conductive material.

Example 18 may include the microelectromechanical device of Example 17, wherein the electrically conductive material is a metal.

Example 19 may include the microelectromechanical device of Example 17, wherein the electrically conductive material is a semiconductor.

Example 20 may include the microelectromechanical device of any one of Examples 1-19, wherein the first electrode is arranged a first distance from the diaphragm and the second electrode is arranged a second distance from the diaphragm, wherein the first distance is different from the second distance.

Example 21 may include the microelectromechanical device of any one of Examples 1-19, wherein the first electrode and the second electrode are offset from each other in a vertical direction when the diaphragm is in an equilibrium position.

Example 22 may include the microelectromechanical device of Example 21, wherein the first electrode and the second electrode are offset to reduce laterally adjacent alignment of the first electrode and the second electrode.

Example 23 may include the microelectromechanical device of any one of Examples 1-19, wherein a fraction of a vertical extension of the first electrode is laterally adjacent to a fraction of a vertical extension of the second electrode when the diaphragm is in an equilibrium position.

Example 24 may include the microelectromechanical device of Example 23, wherein the fraction of the vertical extension of the first electrode is one half.

Example 25 may include the microelectromechanical device of any one of Examples 23 and 24, wherein the fraction of the vertical extension of the second electrode is one half.

Example 26 may include the microelectromechanical device of any one of Examples 1-25, wherein the first electrode may include a plurality of first fingers and wherein the second electrode may include a plurality of second fingers; wherein the plurality of first fingers and the plurality of second fingers are interdigitated.

Example 27 may include the microelectromechanical device of Example 26, wherein each finger of the plurality of first fingers and each finger of the plurality of second fingers are equidistant to each other.

Example 28 may include the microelectromechanical device of Example 27, wherein the distance is less than 1 micrometer.

Example 29 may include the microelectromechanical device of Example 26, wherein the plurality of first fingers and the plurality of second fingers may include: adjacent fingers having a first distance between each other and further adjacent fingers having a second distance between each other; wherein the first distance is different than the second distance.

Example 30 may include the microelectromechanical device of Example 29, wherein the first distance is less than 1 micrometer.

Example 31 may include the microelectromechanical device of any one of Examples 29 and 30, wherein the second distance is between 2 micrometers and 5 micrometers.

Example 32 may include the microelectromechanical device of any one of Examples 26 and 29-31, wherein each finger of the plurality of first fingers is arranged off-centered between two fingers of the plurality of second fingers.

Example 33 may include the microelectromechanical device of any one of Examples 26 and 29-32, wherein the plurality of first fingers and the plurality of second fingers may include: at least one pair of first fingers of the plurality of first fingers adjacent to each other and at least one pair of second fingers of the plurality of second fingers adjacent to each other.

Example 34 may include the microelectromechanical device of any one of Examples 26-33, wherein each finger of the plurality of first fingers and each finger of the plurality of second fingers are parallel with each other.

Example 35 may include the microelectromechanical device of any one of Examples 26-34, wherein each finger of the plurality of first fingers and each finger of the plurality of second fingers is arranged radially with respect to a common vertical axis.

Example 36 may include the microelectromechanical device of any one of Examples 26-35, wherein each finger of the plurality of first fingers and each finger of the plurality of second fingers is arranged symmetrically.

Example 37 may include the microelectromechanical device of any one of Examples 26-36, wherein the plurality of first fingers and the plurality of second fingers are interdigitated in a concentric shell profile with respect to a common vertical axis.

Example 38 may include the microelectromechanical device of Example 37, wherein the concentric shell profile may include circular fingers.

Example 39 may include the microelectromechanical device of Example 37, wherein the concentric shell profile may include ovular fingers.

Example 40 may include the microelectromechanical device of Example 37, wherein the concentric shell profile may include polygonal fingers.

Example 41 may include the microelectromechanical device of Example 37, wherein the polygonal fingers are quadrilateral fingers.

Example 42 may include the microelectromechanical device of Example 41, wherein the quadrilateral fingers are rectangular.

Example 43 may include the microelectromechanical device of Example 42, wherein the quadrilateral fingers are square.

Example 44 may include the microelectromechanical device of any one of Examples 1-43, wherein the first electrode is integral with the diaphragm.

Example 45 may include the microelectromechanical device of any one of Examples 1-44, wherein the first electrode is monolithically integrated with the diaphragm.

Example 46 may include the microelectromechanical device of any one of Examples 1-44, wherein the first electrode further may include at least one via coupling the first electrode to the diaphragm.

Example 47 may include the microelectromechanical device of Example 46, wherein the at least one via electrically couples the first electrode.

Example 48 may include the microelectromechanical device of any one of Examples 46 and 47, wherein the at least one via mechanically couples the first electrode to the diaphragm.

Example 49 may include the microelectromechanical device of any one of Examples 1-48, wherein the second electrode further may include a structure coupling the second electrode to the substrate, wherein the structure is pre-stressed to displace the second electrode in a vertical direction.

Example 50 may include the microelectromechanical device of Example 49, wherein the structure includes a plurality of layers, wherein at least one layer of the plurality of layers is pre-stressed, the pre-stressed layer configured to displace the second electrode in the vertical direction.

Example 51 may include the microelectromechanical device of any one of Examples 1-50, wherein the second electrode further may include at least one spring coupling the second electrode to the substrate.

Example 52 may include the microelectromechanical device of any one of Examples 1-51, wherein the diaphragm further may include at least one ventilation opening.

Example 53 may include the microelectromechanical device of any one of Examples 1-52, wherein the microelectromechanical device includes at least one contact pad electrically coupled to the first electrode and the second electrode.

In an Example 54 of an aspect of the disclosure, a microelectromechanical system including a microelectromechanical device according to any one of Example 1-53, further may include: a circuit electrically coupled to the first electrode and the second electrode, the circuit configured to detect a movement of the first electrode and the second electrode relative to each other and to output a signal representing the movement.

Example 55 may include the microelectromechanical system of Example 54, wherein the circuit is electrically coupled to the first electrode and the second electrode via the at least one contact pad.

In an Example 56 of an aspect of the disclosure, a microelectromechanical device may include: a substrate; a diaphragm mounted to the substrate; a comb electrode structure, which may include: a dynamic electrode mounted to the diaphragm, the dynamic electrode may include a plurality of dynamic fingers; a stator electrode mounted to the substrate, the stator electrode may include a plurality of stator fingers; wherein the plurality of dynamic fingers and the plurality of stator fingers are interdigitated and are laterally adjacent to each other; and wherein the diaphragm is arranged over the plurality of dynamic fingers and the plurality of stator fingers.

Example 57 may include the microelectromechanical device of Example 56, wherein the plurality of dynamic fingers and the plurality of stator fingers have a gap between respective fingers of the plurality of dynamic fingers and the plurality of stator fingers.

Example 58 may include the microelectromechanical device of any one of Examples 56 and 57, wherein the gap is three micrometers.

Example 59 may include the microelectromechanical device of any one of Examples 56-58, wherein the substrate is formed from a semiconductor.

Example 60 may include the microelectromechanical device of Example 59, wherein the semiconductor is silicon.

Example 61 may include the microelectromechanical device of any one of Examples 56-60, wherein the diaphragm is formed from an electrically conductive material.

Example 62 may include the microelectromechanical device of Example 61, wherein the electrically conductive material is a metal.

Example 63 may include the microelectromechanical device of Example 61, wherein the electrically conductive material is a semiconductor.

Example 64 may include the microelectromechanical device of Example 63, wherein the semiconductor is silicon.

Example 65 may include the microelectromechanical device of Example 64, wherein the silicon is a polycrystalline silicon.

Example 66 may include the microelectromechanical device of any one of Examples 56-65, wherein the substrate further may include a cavity, wherein the stator electrode is arranged in the cavity and the dynamic electrode is at least partially located within the cavity.

Example 67 may include the microelectromechanical device of Example 66, wherein the diaphragm covers the cavity.

Example 68 may include the microelectromechanical device of any one of Examples 56-67, wherein the dynamic electrode is arranged a first distance from the diaphragm and the stator electrode is arranged a second distance from the diaphragm.

Example 69 may include the microelectromechanical device of Example 68, wherein the first distance is different from the second distance.

Example 70 may include the microelectromechanical device of any one of Examples 56-67, wherein the dynamic electrode and the stator electrode are offset from each other in a vertical direction when the diaphragm is in an equilibrium position.

Example 71 may include the microelectromechanical device of Example 70, wherein the dynamic electrode and the stator electrode are offset to reduce laterally adjacent alignment of the first electrode and the second electrode.

Example 72 may include the microelectromechanical device of any one of Examples 56-67, wherein a fraction of a vertical extension of the dynamic electrode is laterally adjacent to a fraction of a vertical extension of the stator electrode when the diaphragm is in an equilibrium position.

Example 73 may include the microelectromechanical device of Example 72, wherein the fraction of the vertical extension of the dynamic electrode is one half.

Example 74 may include the microelectromechanical device of any one of Examples 72 and 73, wherein the fraction of the vertical extension of the stator electrode is one half.

Example 75 may include the microelectromechanical device of any one of Examples 56-74, wherein each dynamic finger of the plurality of dynamic fingers and each stator finger of the plurality of stator fingers are equidistant to each other.

Example 76 may include the microelectromechanical device of Example 77, wherein the distance is less than 1 micrometer.

Example 77 may include the microelectromechanical device of any one of Examples 56-74, wherein each finger of the plurality of dynamic fingers and each finger of the plurality of stator fingers are arranged in a plurality of groupings, wherein each dynamic finger within a respective grouping of the plurality of groupings is arranged a first distance from a stator finger within the respective grouping, and wherein each grouping is arranged a second distance from other groupings of the plurality of groupings, wherein the first distance is less than the second distance.

Example 78 may include the microelectromechanical device of any one of Examples 56-74 and 77, wherein the plurality of dynamic fingers and the plurality of stator fingers may include: adjacent fingers having a first distance between each other and further adjacent fingers having a second distance between each other; wherein the first distance is different than the second distance.

Example 79 may include the microelectromechanical device of Example 78, wherein the first distance is less than 1 micrometer.

Example 80 may include the microelectromechanical device of any one of Examples 78 and 79, wherein the second distance is between 2 micrometers and 5 micrometers.

Example 81 may include the microelectromechanical device of any one of Examples 56-74 and 77-80, wherein each dynamic finger of the plurality of dynamic fingers is arranged off-centered between two stator fingers of the plurality of stator fingers.

Example 82 may include the microelectromechanical device of any one of Examples 56-74 and 77-81, wherein the plurality of dynamic fingers and the plurality of second fingers may include: at least one pair of dynamic fingers of the plurality of dynamic fingers adjacent to each other and at least one pair of stator fingers of the plurality of stator fingers adjacent to each other.

Example 83 may include the microelectromechanical device of any one of Examples 56-82, wherein each dynamic finger of the plurality of dynamic fingers and each stator finger of the plurality of stator fingers are parallel with each other.

Example 84 may include the microelectromechanical device of any one of Examples 56-82, wherein each dynamic finger of the plurality of dynamic fingers and each stator finger of the plurality of stator fingers is arranged radially with respect to a common vertical axis.

Example 85 may include the microelectromechanical device of any one of Examples 56-84, wherein each dynamic finger of the plurality of dynamic fingers and each stator finger of the plurality of stator fingers is arranged symmetrically.

Example 86 may include the microelectromechanical device of any one of Examples 56-82, wherein the plurality of dynamic fingers and the plurality of stator fingers are interdigitated in a concentric shell profile with respect to a common vertical axis.

Example 87 may include the microelectromechanical device of Example 86, wherein the concentric shell profile may include circular fingers.

Example 88 may include the microelectromechanical device of Example 86, wherein the concentric shell profile may include ovular fingers.

Example 89 may include the microelectromechanical device of Example 86, wherein the concentric shell profile may include polygonal fingers.

Example 90 may include the microelectromechanical device of Example 89, wherein the polygonal fingers may include quadrilateral fingers.

Example 91 may include the microelectromechanical device of Example 90, wherein the quadrilateral fingers are rectangular.

Example 92 may include the microelectromechanical device of Example 90, wherein the quadrilateral fingers are square.

Example 93 may include the microelectromechanical device of any one of Examples 56-92, wherein the dynamic electrode is integral with the diaphragm.

Example 94 may include the microelectromechanical device of any one of Examples 56-93, wherein the dynamic electrode is monolithically integrated with the diaphragm.

Example 95 may include the microelectromechanical device of any one of Examples 56-94, wherein the dynamic electrode further may include at least one via coupling the dynamic electrode to the diaphragm.

Example 96 may include the microelectromechanical device of Example 95, wherein the at least one via electrically couples the dynamic electrode.

Example 97 may include the microelectromechanical device of any one of Examples 95 and 96, wherein the at least one via mechanically couples the dynamic electrode to the diaphragm.

Example 98 may include the microelectromechanical device of any one of Examples 56-97, wherein the second electrode further may include a structure coupling the stator electrode to the substrate, wherein the structure is pre-stressed to displace the stator electrode in a vertical direction.

Example 99 may include the microelectromechanical device of Example 98, wherein the structure includes a plurality of layers, wherein at least one layer of the plurality of layers is pre-stressed, the pre-stressed layer configured to displace the stator electrode in the vertical direction.

Example 100 may include the microelectromechanical device of any one of Examples 56-99, wherein the second electrode further may include at least one spring coupling the stator electrode to the substrate.

Example 101 may include the microelectromechanical device of any one of Examples 56-100, wherein the diaphragm further may include at least one ventilation opening.

Example 102 may include the microelectromechanical device of any one of Examples 56-101, wherein the microelectromechanical device includes at least one contact pad electrically coupled to the dynamic electrode and the stator electrode.

In Example 103 of an aspect of the disclosure, a microelectromechanical system may include the microelectromechanical device according to any one of Examples 56-102, and further may include: a circuit electrically coupled to the dynamic electrode and the stator electrode, the circuit configured to detect a movement of the dynamic electrode and the stator electrode relative to each other and to output a signal representing the movement.

Example 104 may include the microelectromechanical system of Example 103, wherein the circuit is electrically coupled to the dynamic electrode and the stator electrode via the at least one contact pad.

In an Example 105 of an aspect of the disclosure, the Example 105 may include a method of manufacturing a microelectromechanical device, the method thereof may include: mounting a diaphragm to a substrate; mounting a first electrode to the diaphragm; and mounting a second electrode to the substrate; wherein the first electrode is laterally adjacent to the second electrode; and wherein the diaphragm is arranged over a gap between the first electrode and the second electrode.

Example 106 may include the method of Example 105, and, further may include: coupling a circuit to the first electrode and the second electrode, the circuit configured to detect a movement of the first electrode and the second electrode relative to each other and to output a signal representing the movement.

Example 107 may include the method of any one of Examples 103-106, and, further may include: releasing the first electrode and the second electrode.

Example 108 may include the method of Example 107, wherein releasing the first electrode and the second electrode may include forming a trench between the first electrode and the second electrode.

Example 109 may include the method of any one of Examples 107 and 108, wherein releasing the first electrode and the second electrode may include forming a sacrificial region between the first electrode and the second electrode.

Example 110 may include the method of any one of Examples 107-109, wherein releasing the first electrode and the second electrode may include removing the sacrificial region.

Example 111 may include the method of any one of Examples 103-110, wherein the gap is three micrometers.

Example 112 may include the method of any one of Examples 103-111, wherein the substrate is formed from a semiconductor.

Example 113 may include the method of Example 112, wherein the semiconductor is silicon.

Example 114 may include the method of any one of Examples 103-113, wherein the diaphragm is formed from an electrically conductive material.

Example 115 may include the method of Example 114, wherein the electrically conductive material is a metal.

Example 116 may include the method of Example 115, wherein the electrically conductive material is a semiconductor.

Example 117 may include the method of Example 116, wherein the semiconductor is silicon.

Example 118 may include the method of Example 117, wherein the silicon is a polycrystalline silicon.

Example 119 may include the method of any one of Examples 103-118, and further may include forming a cavity in the substrate.

Example 120 may include the method of Example 119, wherein the second electrode is arranged in the cavity and the first electrode is at least partially located within the cavity.

Example 121 may include the method of any one of Examples 119 and 120, wherein the diaphragm covers the cavity.

Example 122 may include the method of any one of Examples 103-121, which further may include forming a third electrode mounted to either the diaphragm or the substrate, wherein the third electrode is laterally adjacent to the first electrode or the second electrode.

Example 123 may include the method of Example 122, wherein the third electrode is arranged within the cavity.

Example 124 may include the method of Example 122, wherein the third electrode is arranged above the cavity.

Example 125 may include the method of any one of Examples 122-124, wherein the gap between the first electrode and the second electrode is less than a distance from the first electrode to the third electrode and a distance from the second electrode to the third electrode.

Example 126 may include the method of any one of Examples 122-125, wherein the third electrode is formed from an electrically conductive material Example 127 may include the method of Example 126, wherein the electrically conductive material is a metal.

Example 128 may include the method of Example 126, wherein the electrically conductive material is a semiconductor.

Example 129 may include the method of any one of Examples 103-128, wherein the first electrode is arranged a first distance from the diaphragm and the second electrode is arranged a second distance from the diaphragm, wherein the first distance is different from the second distance.

Example 130 may include the method of any one of Examples 103-129, wherein the first electrode and the second electrode are offset from each other in a vertical direction when the diaphragm is in an equilibrium position.

Example 131 may include the method of Example 130, wherein the first electrode and the second electrode are offset to reduce laterally adjacent alignment of the first electrode and the second electrode.

Example 132 may include the method of any one of Examples 103-128, wherein a fraction of a vertical extension of the first electrode is laterally adjacent to a fraction of a vertical extension of the second electrode when the diaphragm is in an equilibrium position.

Example 133 may include the method of Example 132, wherein the fraction of the vertical extension of the first electrode is one half.

Example 134 may include the method of any one of Examples 132 and 133, wherein the fraction of the vertical extension of the second electrode is one half.

Example 135 may include the method of any one of Examples 103-134, wherein the first electrode may include a plurality of first fingers and wherein the second electrode may include a plurality of second fingers; wherein the plurality of first fingers and the plurality of second fingers are interdigitated.

Example 136 may include the method of Example 135, wherein each finger of the plurality of first fingers and each finger of the plurality of second fingers are equidistant to each other.

Example 137 may include the method of Example 136, wherein the distance is less than 1 micrometer.

Example 138 may include the method of Example 135, wherein the plurality of first fingers and the plurality of second fingers may include: adjacent fingers having a first distance between each other and further adjacent fingers having a second distance between each other; wherein the first distance is different than the second distance.

Example 139 may include the method of Example 138, wherein the first distance is less than 1 micrometer.

Example 140 may include the method of any one of Examples 138 and 139, wherein the second distance is between 2 micrometers and 5 micrometers.

Example 141 may include the method of any one of Examples 135 and 138-140, wherein each finger of the plurality of first fingers is arranged off-centered between two fingers of the plurality of second fingers.

Example 142 may include the method of any one of Examples 135 and 138-141, wherein the plurality of first fingers and the plurality of second fingers may include: at least one pair of first fingers of the plurality of first fingers adjacent to each other and at least one pair of second fingers of the plurality of second fingers adjacent to each other.

Example 143 may include the method of any one of Examples 135-142, wherein each finger of the plurality of first fingers and each finger of the plurality of second fingers are parallel with each other.

Example 144 may include the method of any one of Examples 135-143, wherein each finger of the plurality of first fingers and each finger of the plurality of second fingers is arranged radially with respect to a common vertical axis.

Example 145 may include the method of any one of Examples 135-144, wherein each finger of the plurality of first fingers and each finger of the plurality of second fingers is arranged symmetrically.

Example 146 may include the method of any one of Examples 135-145, wherein the plurality of first fingers and the plurality of second fingers are interdigitated in a concentric shell profile with respect to a common vertical axis.

Example 147 may include the method of Example 146, wherein the concentric shell profile may include circular fingers.

Example 148 may include the method of Example 146, wherein the concentric shell profile may include ovular fingers.

Example 149 may include the method of Example 146, wherein the concentric shell profile may include polygonal fingers.

Example 150 may include the method of Example 146, wherein the polygonal fingers are quadrilateral fingers.

Example 151 may include the method of Example 150, wherein the quadrilateral fingers are rectangular.

Example 152 may include the method of Example 151, wherein the quadrilateral fingers are square.

Example 153 may include the method of any one of Examples 103-152, wherein the first electrode is integral with the diaphragm.

Example 154 may include the method of any one of Examples 103-153, wherein the first electrode is monolithically integrated with the diaphragm.

Example 155 may include the method of any one of Examples 103-154, further including forming at least one via coupling the first electrode to the diaphragm.

Example 156 may include the method of Example 155 wherein the at least one via electrically couples the first electrode.

Example 157 may include the method of any one of Examples 155 and 156, wherein the at least one via mechanically couples the first electrode to the diaphragm.

Example 158 may include the method of any one of Examples 103-157, and further may include forming a structure coupling the second electrode to the substrate, wherein the structure is pre-stressed to displace the second electrode in a vertical direction.

Example 159 may include the method of Example 158, wherein forming a structure coupling the second electrode to the substrate may further include forming a first layer over a second layer, wherein one of the first layer and the second layer is pre-stressed, wherein the structure displaces the second electrode in a vertical direction.

Example 160 may include the method of any one of Examples 158 and 159, wherein the structure includes a plurality of layers, wherein at least one layer of the plurality of layers is pre-stressed, the pre-stressed layer configured to displace the second electrode in the vertical direction.

Example 161 may include the method of any one of Examples 103-160, and further may include forming at least one spring coupling the second electrode to the substrate.

Example 162 may include the method of any one of Examples 103-161, and further may include forming at least one ventilation opening in the diaphragm.

Example 163 may include the method of any one of Examples 103-162, wherein the microelectromechanical device includes at least one contact pad electrically coupled to the first electrode and the second electrode.

In an Example 164 of an aspect of the disclosure, a method of manufacturing a microelectromechanical system including a microelectromechanical device according to any one of Examples 103-163, further may include: a circuit electrically coupled to the first electrode and the second electrode, the circuit configured to detect a movement of the first electrode and the second electrode relative to each other and to output a signal representing the movement.

Example 165 may include the method of Example 164, wherein the circuit is electrically coupled to the first electrode and the second electrode via the at least one contact pad.

In an Example 166 of an aspect of the disclosure, a method of manufacturing a microelectromechanical device may include: a substrate; a diaphragm mounted to the substrate; a comb electrode structure may include: a dynamic electrode mounted to the diaphragm, the dynamic electrode may include a plurality of dynamic fingers; a stator electrode mounted to the substrate, the stator electrode may include a plurality of stator fingers; wherein the plurality of dynamic fingers and the plurality of stator fingers are interdigitated and are laterally adjacent to each other; and wherein the diaphragm is arranged over the plurality of dynamic fingers and the plurality of stator fingers.

Example 167 may include the method of Example 166, wherein the plurality of dynamic fingers and the plurality of stator fingers have a gap between respective fingers of the plurality of dynamic fingers and the plurality of stator fingers.

Example 168 may include the method of any one of Examples 166 and 167, wherein the gap is three micrometers.

Example 169 may include the method of any one of Examples 166-168, wherein releasing the first electrode and the second electrode may include forming a trench between the first electrode and the second electrode.

Example 170 may include the method of Example 169, wherein releasing the first electrode and the second electrode may include forming a sacrificial region between the first electrode and the second electrode.

Example 171 may include the method of any one of Examples 166-169, wherein releasing the first electrode and the second electrode may include removing the sacrificial region.

Example 172 may include the method of any one of Examples 166-171, wherein the substrate is formed from a semiconductor.

Example 173 may include the method of Example 172, wherein the semiconductor is silicon.

Example 174 may include the method of any one of Examples 166-173, wherein the diaphragm is formed from an electrically conductive material.

Example 175 may include the method of Example 174, wherein the electrically conductive material is a metal.

Example 176 may include the method of Example 174, wherein the electrically conductive material is a semiconductor.

Example 177 may include the method of Example 176, wherein the semiconductor is silicon.

Example 178 may include the method of Example 177, wherein the silicon is a polycrystalline silicon.

Example 179 may include the method of any one of Examples 166-178, and further may include forming a cavity in the substrate, wherein the stator electrode is arranged in the cavity and the dynamic electrode is at least partially located within the cavity.

Example 180 may include the method of Example 179, wherein the diaphragm covers the cavity.

Example 181 may include the method of any one of Examples 166-180, wherein the dynamic electrode is arranged a first distance from the diaphragm and the stator electrode is arranged a second distance from the diaphragm.

Example 182 may include the method of Example 181, wherein the first distance is different from the second distance.

Example 183 may include the method of any one of Examples 166-182, wherein the dynamic electrode and the stator electrode are offset from each other in a vertical direction when the diaphragm is in an equilibrium position.

Example 184 may include the method of Example 183, wherein the dynamic electrode and the stator electrode are offset to reduce laterally adjacent alignment of the first electrode and the second electrode.

Example 185 may include the method of any one of Examples 166-182, wherein a fraction of a vertical extension of the dynamic electrode is laterally adjacent to a fraction of a vertical extension of the stator electrode when the diaphragm is in an equilibrium position.

Example 186 may include the method of Example 185, wherein the fraction of the vertical extension of the dynamic electrode is one half.

Example 187 may include the method of any one of Examples 185 and 186, wherein the fraction of the vertical extension of the stator electrode is one half.

Example 188 may include the method of any one of Examples 166-187, wherein each dynamic finger of the plurality of dynamic fingers and each stator finger of the plurality of stator fingers are equidistant to each other.

Example 189 may include the method of Example 188, wherein the distance is less than 1 micrometer.

Example 190 may include the method of any one of Examples 166-189, wherein each finger of the plurality of dynamic fingers and each finger of the plurality of stator fingers are arranged in a plurality of groupings, wherein each dynamic finger within a respective grouping of the plurality of groupings is arranged a first distance from a stator finger within the respective grouping, and wherein each grouping is arranged a second distance from other groupings of the plurality of groupings, wherein the first distance is less than the second distance.

Example 191 may include the method of any one of Examples 166-187 and 190, wherein the plurality of dynamic fingers and the plurality of stator fingers may include: adjacent fingers having a first distance between each other and further adjacent fingers having a second distance between each other; wherein the first distance is different than the second distance.

Example 192 may include the method of Example 191, wherein the first distance is less than 1 micrometer.

Example 193 may include the method of any one of Examples 191 and 192, wherein the second distance is between 2 micrometers and 5 micrometers.

Example 194 may include the method of any one of Examples 166-187 and 190-193, wherein each dynamic finger of the plurality of dynamic fingers is arranged off-centered between two stator fingers of the plurality of stator fingers.

Example 195 may include the method of any one of Examples 166-187 and 190-194, wherein the plurality of dynamic fingers and the plurality of second fingers may include: at least one pair of dynamic fingers of the plurality of dynamic fingers adjacent to each other and at least one pair of stator fingers of the plurality of stator fingers adjacent to each other.

Example 196 may include the method of any one of Examples 166-195, wherein each dynamic finger of the plurality of dynamic fingers and each stator finger of the plurality of stator fingers are parallel with each other.

Example 197 may include the method of any one of Examples 166-195, wherein each dynamic finger of the plurality of dynamic fingers and each stator finger of the plurality of stator fingers is arranged radially with respect to a common vertical axis.

Example 198 may include the method of any one of Examples 166-198, wherein each dynamic finger of the plurality of dynamic fingers and each stator finger of the plurality of stator fingers is arranged symmetrically.

Example 199 may include the method of any one of Examples 166-198, wherein the plurality of dynamic fingers and the plurality of stator fingers are interdigitated in a concentric shell profile with respect to a common vertical axis.

Example 200 may include the method of Example 199, wherein the concentric shell profile may include circular fingers.

Example 201 may include the method of Example 199, wherein the concentric shell profile may include ovular fingers.

Example 202 may include the method of Example 199, wherein the concentric shell profile may include polygonal fingers.

Example 203 may include the method of Example 199, wherein the polygonal fingers may include quadrilateral fingers.

Example 204 may include the method of Example 203, wherein the quadrilateral fingers are rectangular.

Example 205 may include the method of Example 204, wherein the quadrilateral fingers are square.

Example 206 may include the method of any one of Examples 166-205, wherein the dynamic electrode is integral with the diaphragm.

Example 207 may include the method of any one of Examples 166-206, wherein the dynamic electrode is monolithically integrated with the diaphragm.

Example 208 may include the method of any one of Examples 166-207, and further may include forming at least one via coupling the dynamic electrode to the diaphragm.

Example 209 may include the method of Example 208, wherein the at least one via electrically couples the dynamic electrode.

Example 210 may include the method of any one of Examples 208 and 209, wherein the at least one via mechanically couples the dynamic electrode to the diaphragm.

Example 211 may include the method of any one of Examples 166-210, and further may include forming a structure coupling the second electrode to the substrate, wherein the structure is pre-stressed to displace the second electrode in a vertical direction.

Example 212 may include the method of any one of Examples 211, wherein forming a structure coupling the second electrode to the substrate may further include forming a first layer over a second layer, wherein one of the first layer and the second layer is pre-stressed, wherein the structure displaces the second electrode in a vertical direction.

Example 213 may include the method of any one of Examples 211 and 212, wherein the structure includes a plurality of layers, wherein at least one layer of the plurality of layers is pre-stressed, the pre-stressed layer configured to displace the stator electrode in the vertical direction.

Example 214 may include the method of any one of Examples 166-213, and further may include forming at least one spring coupling the stator electrode to the substrate.

Example 215 may include the method of any one of Examples 166-214, and further may include forming at least one ventilation opening in the diaphragm.

Example 216 may include the method of any one of Examples 166-215, wherein the microelectromechanical device includes at least one contact pad electrically coupled to the dynamic electrode and the stator electrode.

In Example 217 of an aspect of the disclosure, a method of manufacturing a microelectromechanical system may include manufacturing the microelectromechanical device according to any one of Examples 166-216, and further may include: a circuit electrically coupled to the dynamic electrode and the stator electrode, the circuit configured to detect a movement of the dynamic electrode and the stator electrode relative to each other and to output a signal representing the movement.

Example 218 may include the method of Example 217, wherein the circuit is electrically coupled to the dynamic electrode and the stator electrode via the at least one contact pad.

While the invention has been particularly shown and described with reference to specific embodiments, it should be understood by those skilled in the art that various changes in form and detail may be made therein without departing from the spirit and scope of the invention as defined by the appended Claims. The scope of the invention is thus indicated by the appended Claims, and all changes within the meaning and range of equivalency of the Claims are therefore intended to be embraced.

What is claimed is:

1. A microelectromechanical device comprising:
   a substrate;
   a diaphragm mounted to the substrate;
   a first electrode mounted to the diaphragm, the first electrode comprising a plurality of first fingers having a cross-sectional height greater than a cross-sectional width both taken perpendicular to a longest dimension of a first finger of the plurality of first fingers;
   a second electrode mounted to the substrate, the second electrode comprising a plurality of second fingers having a cross-sectional height greater than a cross-sectional width both taken perpendicular to a longest dimension of a second finger of the plurality of second fingers;
   wherein the first electrode is laterally adjacent to the second electrode and the plurality of first fingers and the plurality of second fingers are interdigitated; and
   wherein the diaphragm is arranged over a gap between the first electrode and the second electrode.

2. The microelectromechanical device of claim 1, further comprising:
   a third electrode mounted to either side of the diaphragm or the substrate,
   wherein the third electrode is laterally adjacent to the first electrode or the second electrode.

3. The microelectromechanical device of claim 2,
   wherein the gap between the first electrode and the second electrode is less than a distance from the first electrode to the third electrode and a distance from the second electrode to the third electrode.

4. The microelectromechanical device of claim 1,
   wherein the first electrode is arranged a first distance from the diaphragm and the second electrode is arranged a second distance from the diaphragm, and wherein the first distance is different from the second distance.

5. The microelectromechanical device of claim 1,
   wherein each finger of the plurality of first fingers and each finger of the plurality of second fingers are equidistant to each other.

6. The microelectromechanical device of claim 1, wherein the plurality of first fingers and the plurality of second fingers comprise:
   adjacent fingers having a first distance between each other and further adjacent fingers having a second distance between each other;
   wherein the first distance is different than the second distance.

7. The microelectromechanical device of claim 1,
   wherein each finger of the plurality of first fingers is arranged off-centered between two fingers of the plurality of second fingers.

8. The microelectromechanical device of claim 1,
   wherein the plurality of first fingers and the plurality of second fingers comprise:
   at least one pair of first fingers of the plurality of first fingers adjacent to each other and
   at least one pair of second fingers of the plurality of second fingers adjacent to each other.

9. The microelectromechanical device of claim 1,
   wherein each finger of the plurality of first fingers and each finger of the plurality of second fingers are parallel with each other.

10. The microelectromechanical device of claim 1,
    wherein each finger of the plurality of first fingers and each finger of the plurality of second fingers is arranged radially with respect to a common vertical axis.

11. The microelectromechanical device of claim 1,
    wherein the plurality of first fingers and the plurality of second fingers are interdigitated in a concentric shell profile with respect to a common vertical axis.

12. The microelectromechanical device of claim 1,
    wherein the first electrode is integral with the diaphragm.

13. The microelectromechanical device of claim 1,
    wherein the first electrode further comprises at least one via coupling the first electrode to the diaphragm.

14. The microelectromechanical device of claim 1,
    wherein the second electrode further comprises a structure coupling the second electrode to the substrate, wherein the structure is pre-stressed to displace the second electrode in a vertical direction.

15. The microelectromechanical device of claim 1, wherein the second electrode further comprises a spring coupling the second electrode to the substrate to further displace the second electrode in a vertical direction.

16. A microelectromechanical system comprising:
the microelectromechanical device of claim 1 and
a circuit electrically coupled to the first electrode and the second electrode, the circuit configured to detect a movement of the first electrode and the second electrode relative to each other and to output a signal representing the movement.

17. The microelectromechanical system of claim 16, wherein the circuit is further configured to provide a potential to at least one of the first electrode and the second electrode.

18. A microelectromechanical device comprising:
a substrate;
a diaphragm mounted to the substrate;
a first electrode mounted to the diaphragm, the first electrode comprising a plurality of first fingers;
a second electrode mounted to the substrate, the second electrode comprising a plurality of second fingers;
wherein the first electrode is laterally adjacent to the second electrode and the plurality of first fingers and the plurality of second fingers are interdigitated;
wherein the plurality of first fingers and the plurality of second fingers comprise:
adjacent fingers having a first distance between each other and further adjacent fingers having a second distance between each other;
wherein the first distance is different than the second distance;
and
wherein the diaphragm is arranged over a gap between the first electrode and the second electrode.

19. A microelectromechanical device comprising:
a substrate;
a diaphragm mounted to the substrate;
a first electrode mounted to the diaphragm, the first electrode comprising a plurality of first fingers;
a second electrode mounted to the substrate, the second electrode comprising a plurality of second fingers;
wherein the first electrode is laterally adjacent to the second electrode and the plurality of first fingers and the plurality of second fingers are interdigitated;
wherein each finger of the plurality of first fingers and each finger of the plurality of second fingers is arranged radially with respect to a common vertical axis; and
wherein the diaphragm is arranged over a gap between the first electrode and the second electrode.

* * * * *